United States Patent [19]
Kusunoki et al.

[11] Patent Number: 5,825,203
[45] Date of Patent: Oct. 20, 1998

[54] VARIABLE LOGIC INTEGRATED CIRCUIT DEVICE HAVING CONNECTIONS THROUGH SWITCH MATRIX AND TOP LAYERS FOR INTER-CELL CONNECTIONS

[75] Inventors: Mitsugu Kusunoki, Koganei; Nobuo Tamba, Ome, both of Japan

[73] Assignee: Hitachi, Ltd., Tokyo, Japan

[21] Appl. No.: 747,339

[22] Filed: Nov. 12, 1996

[30] Foreign Application Priority Data

Nov. 28, 1995 [JP] Japan ................................. 7-308733

[51] Int. Cl.$^6$ ................................. H03K 19/177
[52] U.S. Cl. ................................. 326/41; 326/38
[58] Field of Search ................................. 321/39, 41, 47, 321/38; 257/208, 209, 210, 211, 212

[56] References Cited

U.S. PATENT DOCUMENTS

| | | | |
|---|---|---|---|
| 5,003,200 | 3/1991 | Sakamoto | 326/38 |
| 5,448,186 | 9/1995 | Kawata | 326/41 |
| 5,543,640 | 8/1996 | Sutherland et al. | 257/208 |
| 5,631,478 | 5/1997 | Okumura | 257/211 |

FOREIGN PATENT DOCUMENTS 5-343983  12/1993  Japan .

OTHER PUBLICATIONS

Information Processing Society of Japan, "Information Processing", vol. 35, No. 6, pp. 505–510., Jun. 1994.

*Primary Examiner*—Jon Santamauro
*Assistant Examiner*—Don Le
*Attorney, Agent, or Firm*—Fay, Sharpe, Beall, Fagan, Minnich & McKee

[57] ABSTRACT

A variable logic integrated circuit device formed on a semiconductor chip comprising variable logic blocks and switch matrices laid out alternately in the X and Y directions in a checkerboard pattern. Above the variable logic blocks is a block interconnection wiring arrangement formed by multiple-layer wiring techniques. The variable logic blocks and switch matrices are wired into circuits respectively by a lower wiring layer in the multiple wiring layer setup of the chip. The block interconnection wiring is formed by an upper wiring layer extending above the variable logic blocks and included in the multiple wiring layer setup. The switch matrices are used to connect the block interconnection lines to one another as well as to the variable logic blocks.

25 Claims, 28 Drawing Sheets

FIG. 19

| Top row | Bottom row |
|---|---|
| PS26 | PS1 SW5 |
| PS28 | PS1 SW1 |
| PS21 | PS1 SW2 |
| PS23 | PS18 |
| PS2 SW6 | PS16 |
| PS2 SW2 | PS14 |
| PS2 SW1 | PS12 |
| PS15 | PS1 SW3 |
| PS17 | PS1 SW4 |
| PS11 | PS1 SW6 |
| PS13 | PS24 |
| PS2 SW4 | PS22 |
| PS2 SW3 | PS27 |
| PS2 SW5 | PS25 |

5,825,203

VARIABLE LOGIC INTEGRATED CIRCUIT DEVICE HAVING CONNECTIONS THROUGH SWITCH MATRIX AND TOP LAYERS FOR INTER-CELL CONNECTIONS

BACKGROUND OF THE INVENTION

The present invention relates to semiconductor integrated circuit technology and, more particularly, to techniques applied advantageously to variable logic integrated circuit devices in which the wiring between circuits may be varied, such as programmable logic LSIs (large scale integration devices) including the FPGA (field programmable gate array) and FPLA (field programmable logic array) wherein the user may establish logic as desired.

One conventional type of user-programmable logic LSI is the FPGA such as is shown in FIG. 29. The FPGA of FIG. 29 comprises programmable logic blocks PLB whose logic functions may be selected as desired by the user, cross point switches CPS each surrounded by four logic blocks (upper, lower, left-hand and right-hand), and switch matrices SMX each surrounded by diagonally upward two logic blocks and diagonally downward two logic blocks. Each programmable logic block PLB includes an SRAM (static random access memory), ROM (read only memory) or fuses. The logic function of a given programmable logic block is programmed when its programmable information ("1" or "0"; alternatively, "conductive" or "nonconductive") is set externally.

Patterns of wiring are formed in advance between the logic blocks. The connection or disconnection of the wiring between any two logic blocks is established through the intervention of a cross point switch CPS or a switch matrix SMX. As with the logic block, each cross point switch CPS or switch matrix SMX incorporates an SRAM. The wiring pattern between any two logic blocks is programmed by setting the appropriate programmable information ("1" or "0") to the applicable cross point switch CPS or switch matrix SMX. This type of FPGA is described illustratively in a periodical of the Information Processing Society of Japan, "Joho Shori (Information Processing)," Vol. 35, No. 6, pp. 505–510, 1994.

SUMMARY OF THE INVENTION

The FPGA of FIG. 29 has a distinctive disadvantage: because the cross point switches CPS and switch matrices SMX connecting the logic blocks PLB take up an inordinately large area compared with the regions occupied by the logic blocks PLB, the gate array comprising these components has a larger chip size than gate arrays of the same logic scale. The result is a reduced yield of the FPGA.

Another disadvantage of the FPGA in FIG. 29 is that when desired logic blocks are interconnected by means of the appropriate cross point switches CPS and switch matrices SMX, the numerous switches furnished on the wiring slow down the speed of signals transmitted between the blocks. As a result, it is difficult to improve the operating speed of the FPGA.

It is therefore an object of the present invention to provide a variable logic integrated circuit device with its wiring regions occupying regions smaller than those occupied by logic blocks, whereby the chip size of the device is reduced.

It is another object of the present invention to provide a variable logic integrated circuit incorporating a variable wiring connection technique involving a reduced number of switches furnished on the wiring for connecting logic blocks, whereby the delay time in signal propagation is minimized and the operating speed of the circuit enhanced.

These and other objects, features and advantages of the invention will become more apparent upon a reading of the following description and appended drawings.

Major features the invention disclosed herein are outlined below:

According to one aspect of the invention, there is provided a variable logic integrated circuit device formed on a semiconductor chip and comprising a plurality of variable logic blocks and a plurality of switch matrices laid out alternately in the X and Y directions in a checkerboard pattern. Above the variable logic blocks are block interconnection wiring regions formed by multiple-layer wiring techniques. This structure lowers the rate of the area occupied by the switch matrices with respect to the area taken up by the variable logic blocks in the semiconductor chip, whereby the chip size is reduced.

Preferably, the wiring for interconnecting the logic blocks and the wiring for connecting the variable logic blocks to the switch matrices may be formed in the same layer. The layer of the intra-circuit wiring constituting the variable logic blocks and switch matrices may be located below the layer of the block interconnection wiring. This structure also contributes to reducing the chip size.

The switch matrices may be used to control the connection between the wiring lines for interconnecting the logic blocks, as well as the connection between the wiring for interconnecting the logic blocks on the one hand, and the variable logic blocks on the other hand.

Furthermore, the variable logic integrated circuit device according to the invention may comprise only a plurality of variable logic blocks and a plurality of switch matrices. With cross point switches omitted from the device, there is a significant reduction in the number of switches furnished on the wiring for interconnecting the logic blocks. This structure shortens the delay time in signal transmission to thereby constitute a variable logic integrated circuit device capable of high-speed operations.

BRIEF DESCRIPTION OF THE DRAWINGS

FIG. 19 is a schematic view of a typical layout of circuits in the switch matrix of FIG. 17;

DETAILED DESCRIPTION OF THE PREFERRED EMBODIMENTS

One preferred embodiment of the present invention will now be described with reference to the accompanying drawings.

Figure 1B:
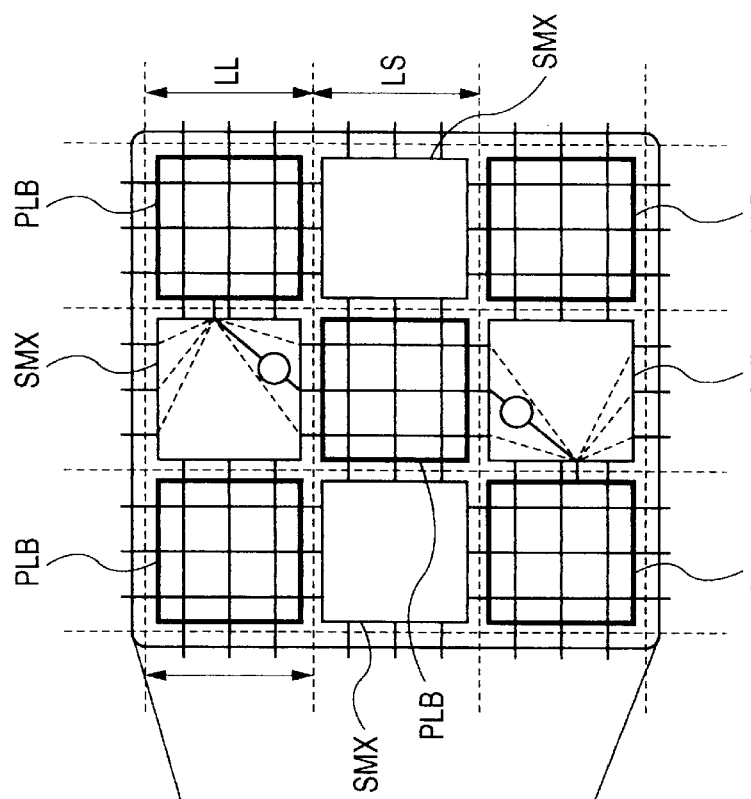
FIG. 1B is an enlarged detail view of the device in FIG. 1A.
Figure 1A:
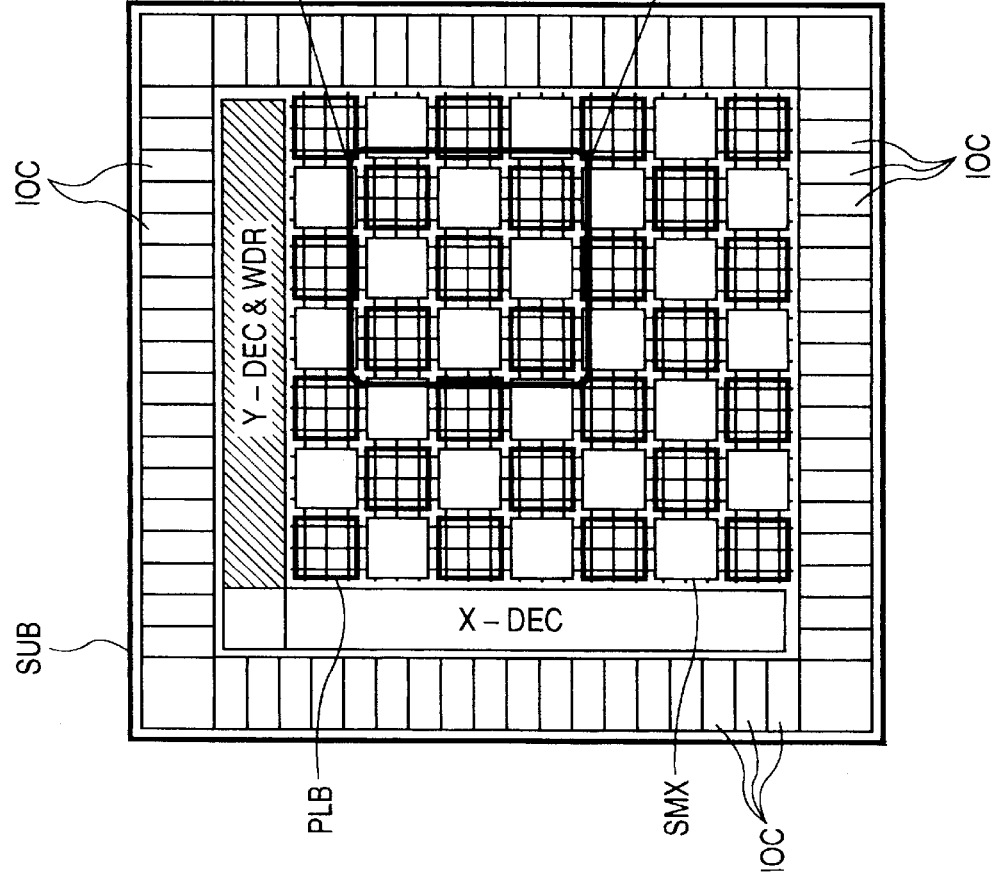
FIG. 1A is a block diagram showing an overall layout of a programmable logic LSI embodying the invention.

FIG. 1A is a block diagram showing an overall layout of a programmable logic LSI embodying the invention as a variable logic integrated circuit device. In FIG. 1, reference characters SUB stand for a semiconductor substrate (chip) illustratively made of single crystal silicon; PLB for variable logic blocks whose logic functions may be varied externally; and SMX for switch matrices each acting as a variable wiring circuit whose wiring line interconnecting status may be varied externally. FIG. 1B is an enlarged detail view of some variable logic blocks PLB and switch matrices SMX constituting part of the device in FIG. 1A. As shown in FIGS. 1A and 1B, the variable logic blocks PLB and switch matrices SMX are laid out alternately in a checkerboard pattern in the X direction (crosswise) and Y direction (lengthwise) on a quadratic plane. In other words, the variable logic blocks PLB and switch matrices SMX are laid out so that in both the X and the Y directions, one switch matrix SMX is located between two variable logic blocks PLB and one variable logic block PLB between two switch matrices SMX.

The array made up of the variable logic blocks PLB and switch matrices SMX has two of its sides (the left-hand and upper sides in FIG. 1A) furnished with an X decoder circuit X-DEC and a Y decoder and write circuit Y-DEC & WDR. The two components are designed selectively to write data to any of the memory cells (described later) in the variable logic blocks PLB and switch matrices SMX. Surrounding these circuits are I/O buffer cells IOC provided along the chip periphery. Most of the I/O buffer cells 10C handle I/O signals regarding the logic circuits constituted by the variable logic blocks PLB and switch matrices SMX; some I/O buffer cells act as circuits for dealing with input signals to the X decoder circuit X-DEC and Y decoder and write circuit Y-DEC & WDR.

In the variable logic LSI embodying the invention, wiring regions are formed above the variable logic blocks PLB and switch matrices SMX by application of multiple layer wiring techniques. The signal lines (word and data lines) connecting the X decoder circuit X-DEC and Y decoder and write circuit Y-DEC & WDR to the memory cells (to be described later) in the variable logic blocks PLB and switch matrices SMX are formed by utilizing the wiring regions provided above the variable logic blocks and switch matrices. As will be described later, the variable logic blocks PLB and switch matrices SMX include MOSFETs (or MISFETs). The MOSFETs are interconnected mostly by use of a lower wiring layer in the multiple wiring layer setup, whereby the variable logic blocks PLB are formed. An upper wiring layer in the multiple wiring layer setup above the variable logic blocks PLB is used mostly to interconnect the switch matrices SMX. Part of the upper wiring layer in the multiple wiring layer setup above the switch matrices SMX is also used to interconnect the switch matrices SMX.

Figure 27:
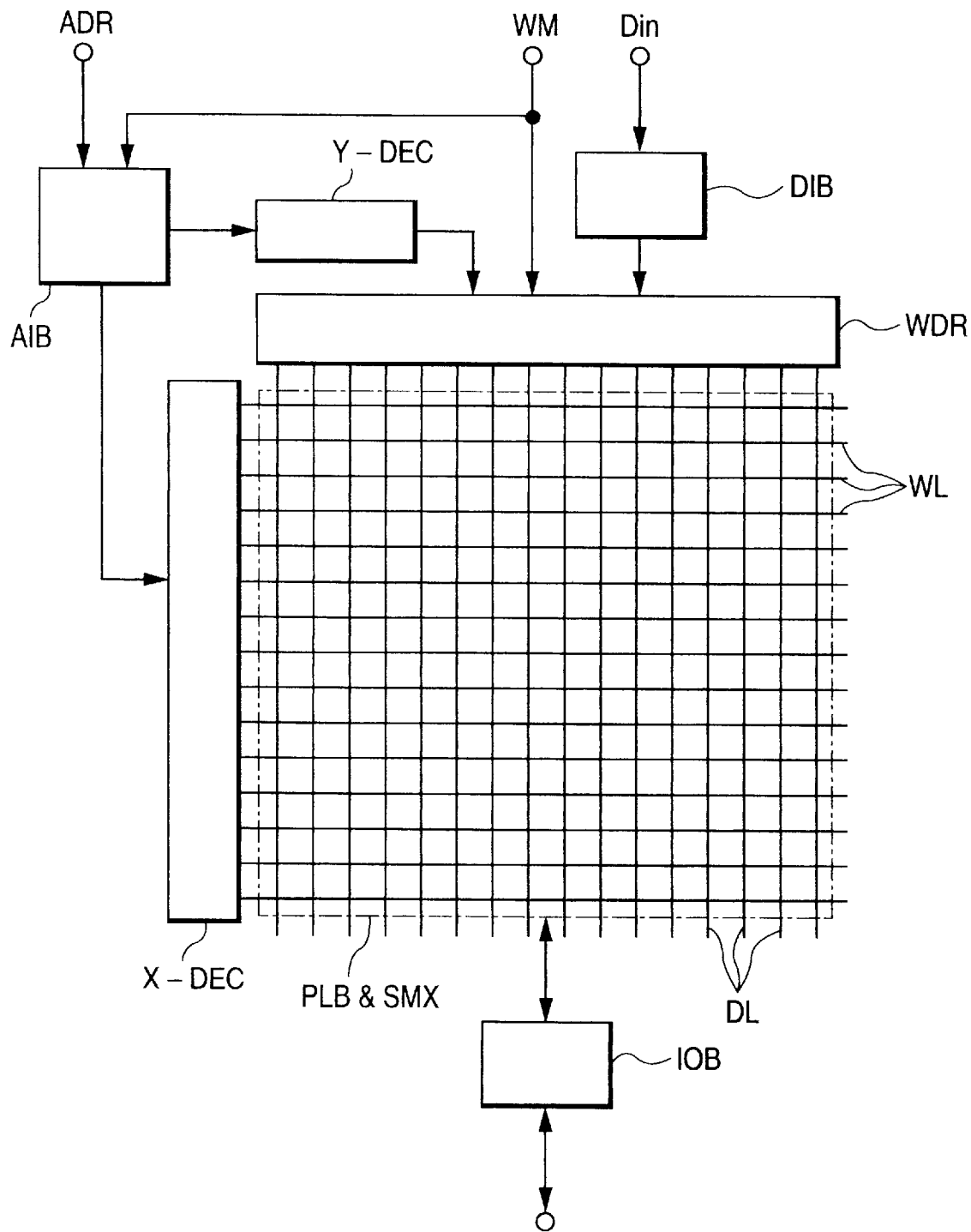
FIG. 27 is a circuit diagram of a data write circuit for writing data to any of the memory cells constituting a variable logic block or a switch matrix.

FIG. 27 is a circuit diagram of a typical data write circuit for writing data to any of the memory cells. The data write circuit is activated illustratively upon system initialization apart from the normal operation of the logic LSI. The switchover between the normal operation and the memory cell write operation on the logic LSI is accomplished illustratively using a control signal WM fed to a mode switching control terminal from outside the chip. When the control signal WM designates memory cell write mode, an externally supplied address signal ADR is admitted into an address input buffer circuit AIB. From there, the address signal is sent to the X decoder circuit X-DEC and Y decoder circuit Y-DEC whereby the signal is decoded.

In accordance with the admitted X address signal, the X decoder circuit X-DEC brings to the selected level one of a plurality of word lines WL extending from the X decoder circuit X-DEC to the array of the variable logic blocks PLB and switch matrices SMX. The output of the Y decoder circuit Y-DEC is supplied to the write circuit WDR. In turn, the write circuit WDR selects illustratively one of a plurality of data lines DL extending from the Y-decoder circuit Y-DEC to the array of the variable logic blocks PLB and switch matrices SMX. At the same time, the write circuit WDR drives the selected data line DL either High or Low in keeping with data information ("1" or "0") entered from the outside via the data input buffer circuit DIB.

Reference characters IOB stand for an I/O signal buffer circuit for the ordinary logic portion formed by variable logic blocks and switch matrices. It is the I/O buffer cells IOC shown in FIG. 1A that constitute the I/O signal buffer circuit IOB, the address input buffer circuit AIB and the data input buffer circuit DIB.

Figure 2A:
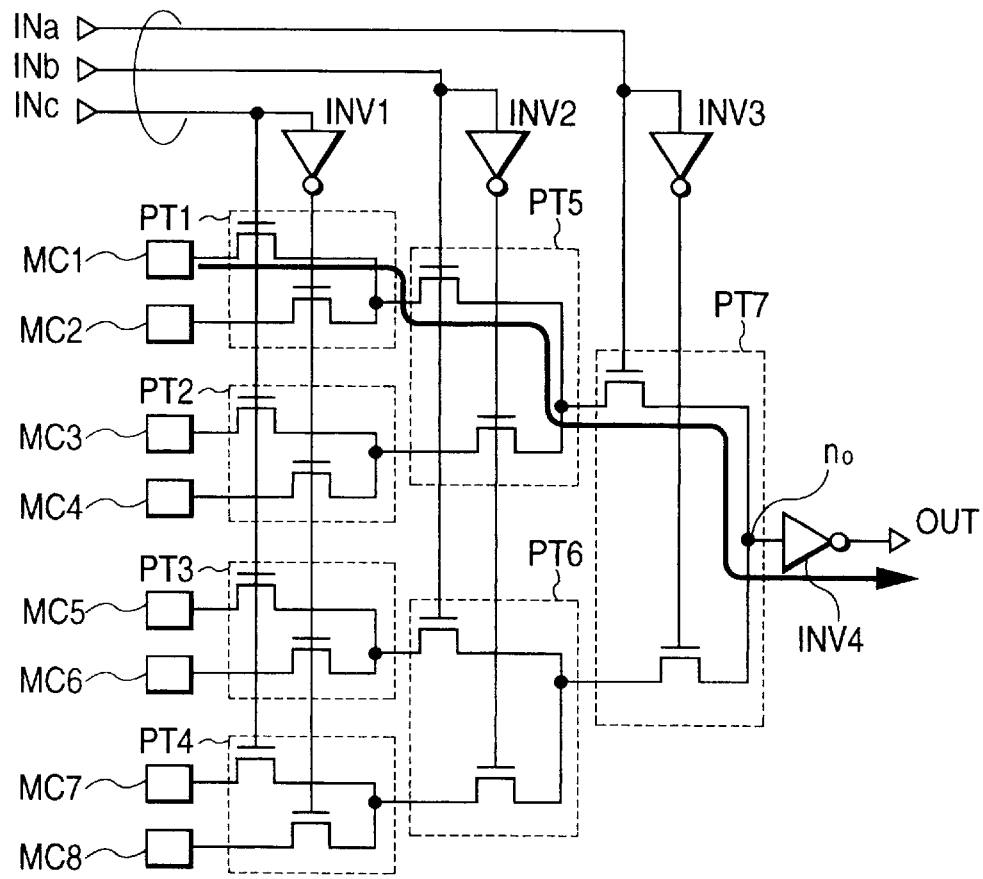
FIG. 2A is a circuit diagram of a typical variable logic block.

A typical variable logic block PLB will now be described by referring to FIG. 2A. FIG. 2A is a circuit diagram of a three-input variable logic block comprising eight memory cells MC1 through MC8.

In FIG. 2A, the memory cells MC1 through MC8 have their stored values transmitted to a common output node n0. Such signal transmission is accomplished by the variable logic block of FIG. 2A comprising MOS (metal oxide semiconductor) transfer gate pairs PT1 through PT7 forming a pyramid-structured signal transmission means, an output inverter INV4 connected to the common output node n0, an inverter INV1 generating the signal for controlling the MOS transfer gate pairs PT1 through PT4 based on an input signal INc, an inverter INV2 generating the signal for controlling the MOS transfer gate pairs PT5 and PT6 based on an input signal INb, and an inverter INV3 generating the signal for controlling the MOS transfer gate pair PT7 based on an input signal INa.

The MOS transfer gate pairs PT1 through PT6 and inverters INV1 through INV4 are composed of MOSFETs (metal oxide semiconductor field effect transistors) or MISFETs (metal insulator semiconductor field effect transistors). The description that follows assumes the use of MOSFETs as gate and inverter elements although the invention is not limited thereby. As will be described later with reference to FIG. 5A, the MOS transfer gate pairs PT1 through PT6 are each composed of a pair of n-channel MOSFETs Qn, and the inverters INV1 through INV4 are each constituted by an n-channel MOSFET Qn1 and a p-channel MOSFET Qp1. The n-channel MOSFETs Qn, Qn1 and n-channel MOSFETs MN0, MN1, MN2 and MN3 constituting the memory cells MC1 through MC8 are made up of nMOSs, as will be described later with reference to FIG. 5B. The p-channel MOSFETs Qp, Qp1 and p-channel MOSFETs MP1, MP2 and MP3 constituting the memory cells MC1 through MC8 are composed of pMOSs, to be described later also with reference to FIG. 5B.

Structured as outlined above, the variable logic block PLB of this embodiment provides up to 256 logic functions including NOR and AND. These logic functions are implemented by setting appropriately combined data ("1" or "0") to the memory cells MC1 through MC8.

Figure 2B:
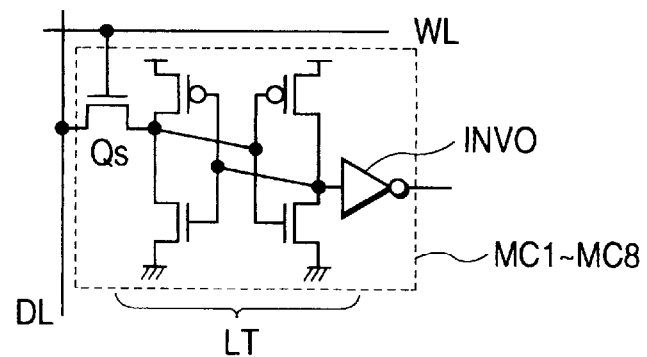
FIG. 2B is a circuit diagram of a typical memory cell constituting part of a variable logic block.

As shown in FIG. 2B, the memory cells MC1 through MC8 are each composed illustratively of a selecting MOSFET Qs in which the gate and the drain are connected to the word line WL and data line DL respectively, a latch circuit LT formed by a pair of CMOS (complementary MOS) inverters with their input and output terminals connected, and an output inverter INV0 connected to the other I/O node of the latch circuit LT.

The memory cells of this embodiment are used as follows: driving the word line WL High turns on the MOSFET Qs of each memory cell. Then supplying desired data ("1" or "0") from the data line DL to the memory cell uniquely sets the logic of the variable logic block. Setting of the logic may be carried out illustratively upon system initialization. Where the memory cells are of static type (e.g., SRAM), the logic of each variable logic block may be changed every time initialization is carried out. This allows the logic LSI to offer diverse functions.

The memory cells constituting the variable logic block are not limited to the static type as shown in FIG. 2B. Alternatively, the FAMOS (floating gate avalanche injection MOSFETs) making up the EPROM (erasable programmable read only memory), the EEPROM (electrically erasable programmable read only memory) such as the flash memory, or fuse elements may be used instead.

Figure 3:
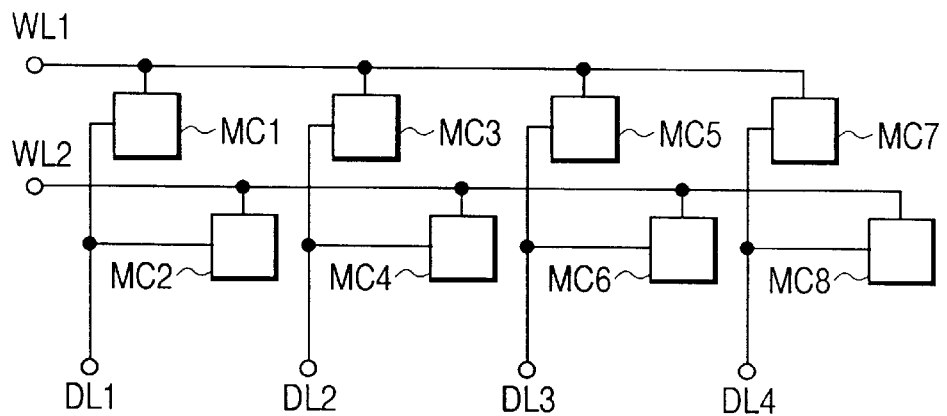
FIG. 3 is a block diagram outlining signal connections between memory cells making up part of a variable logic block.

FIG. 3 is a block diagram of a specific circuit arrangement including word and data lines for writing data to the memory cells MC1 through MC8 which are of static type as shown in FIG. 2B, the memory cells constituting the variable logic block PLB of FIG. 2A. The eight memory cells are arranged in two rows corresponding to the word lines WL1 and WL2. The word lines are intersected perpendicularly by four data lines DL1 through DL4 each connected to two memory cells MC. The two memory cells connected to one data line are called a memory cell pair.

As described, a plurality of variable logic blocks PLB and a plurality of switch matrices SMX are laid out in a checkerboard pattern on the LSI chip. Each word line WL connects commonly with the gate terminals of the selecting MOSFETs in the corresponding memory cells MC of the variable logic blocks PLB and switch matrices SMX arranged in the word line direction. Each data line DL connects commonly with the drain terminals of the selecting MOSFETs in the corresponding memory cells MC of the variable logic blocks PLB and switch matrices SMX arranged in the data line direction. The memory cells in the switch matrices SMX will be described later in more detail.

The end of each data line DL may preferably be connected, but not limited, to an MOSFET for pull-up purposes. The MOSFET attachment prevents erroneous data from getting written to memory cells when the data line in its high impedance state (i.e., unselected state) has the data line potential changed by noise.

Figure 4:
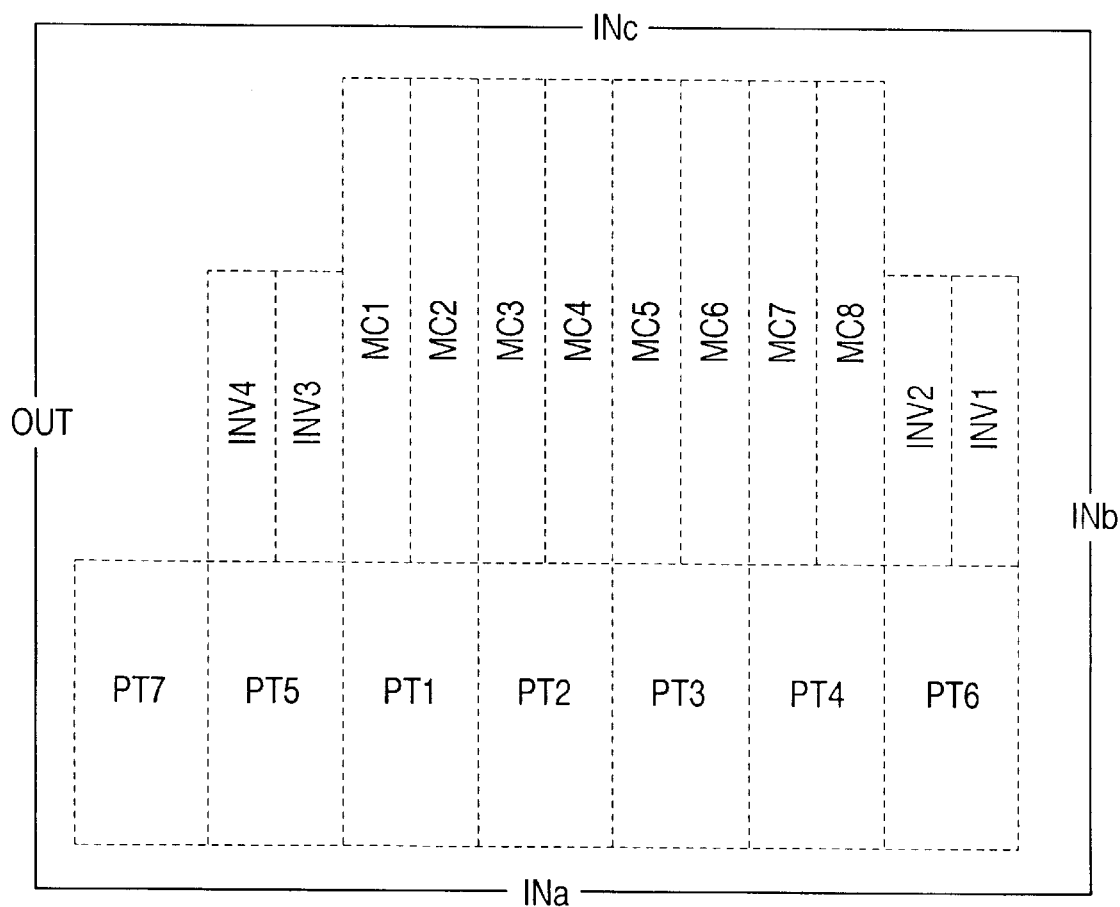
FIG. 4 is a schematic view of a typical layout of circuits in a variable logic block.
Figure 5A:
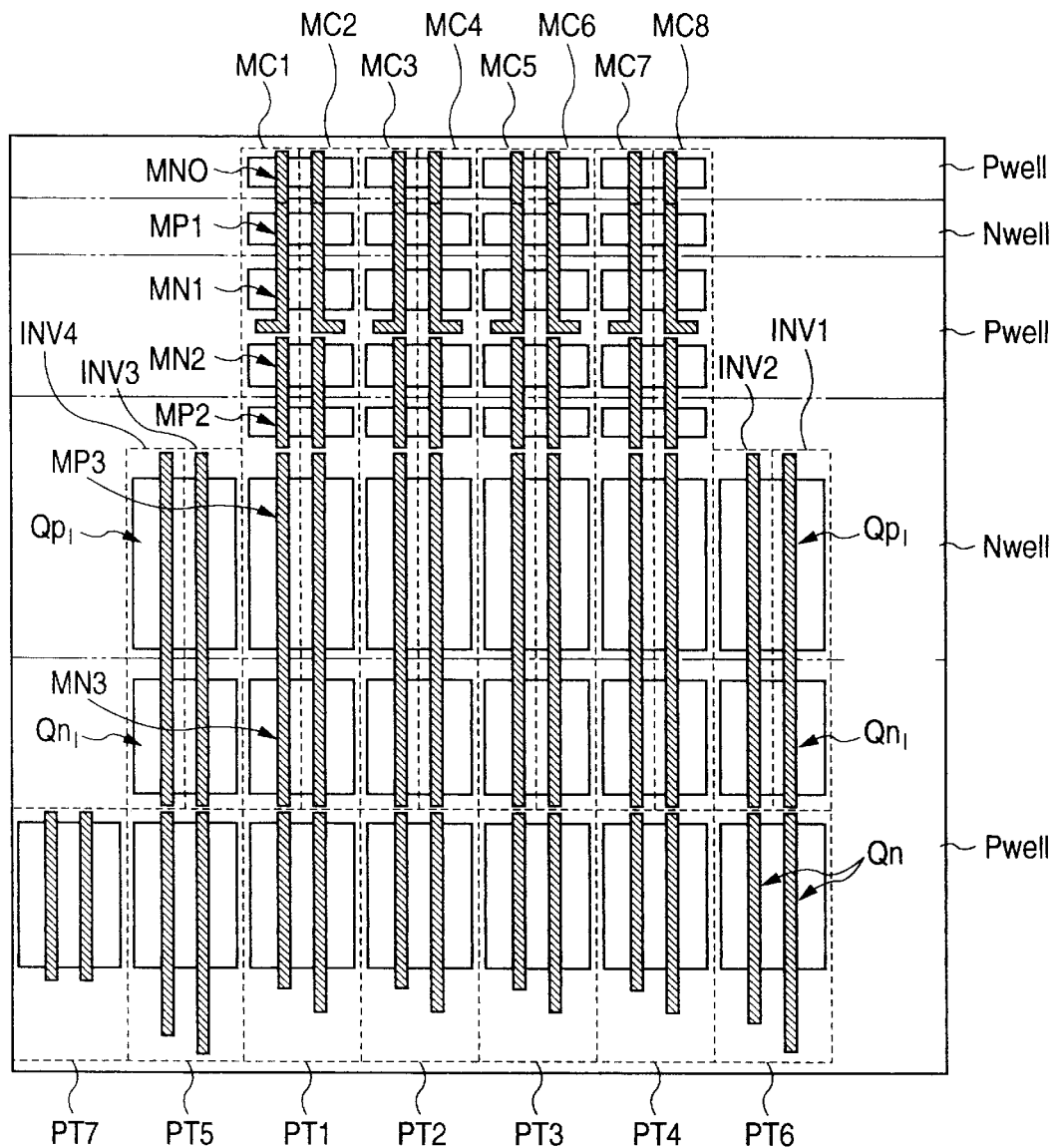
FIG. 5A is a schematic view of a typical layout of elements in a variable logic block.
Figure 5B:
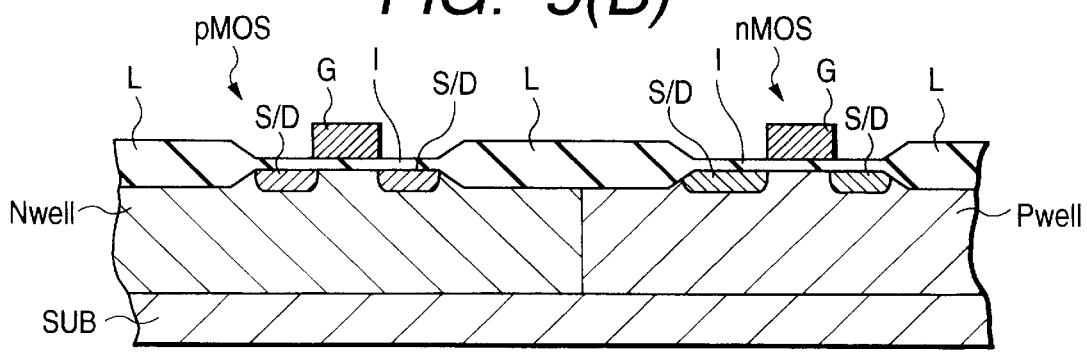
FIG. 5B is a partial cross-sectional view of the layout in FIG. 5A.
Figure 6:
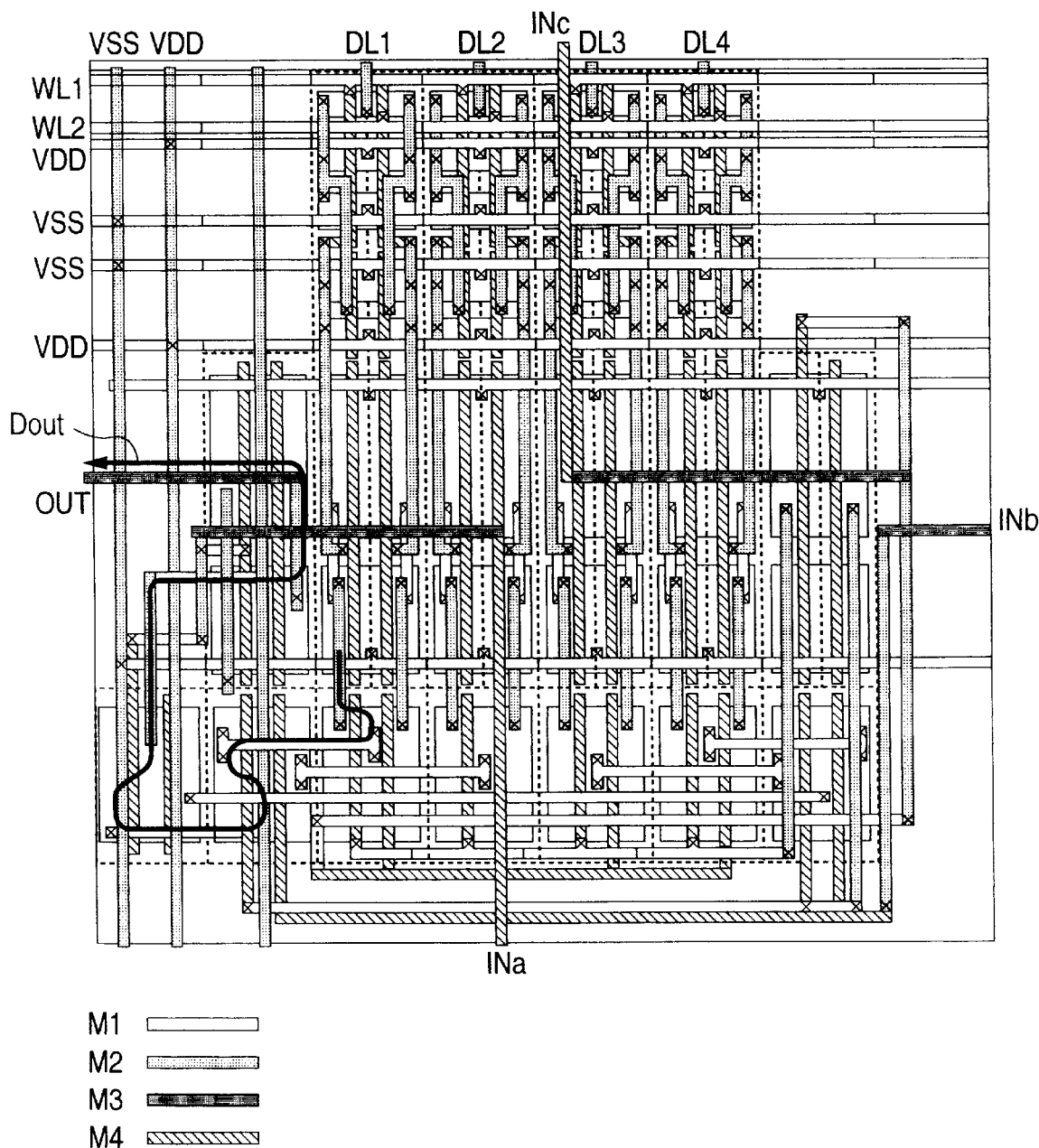
FIG. 6 is a plan view of a typical layout of a variable logic block.
Figure 7:
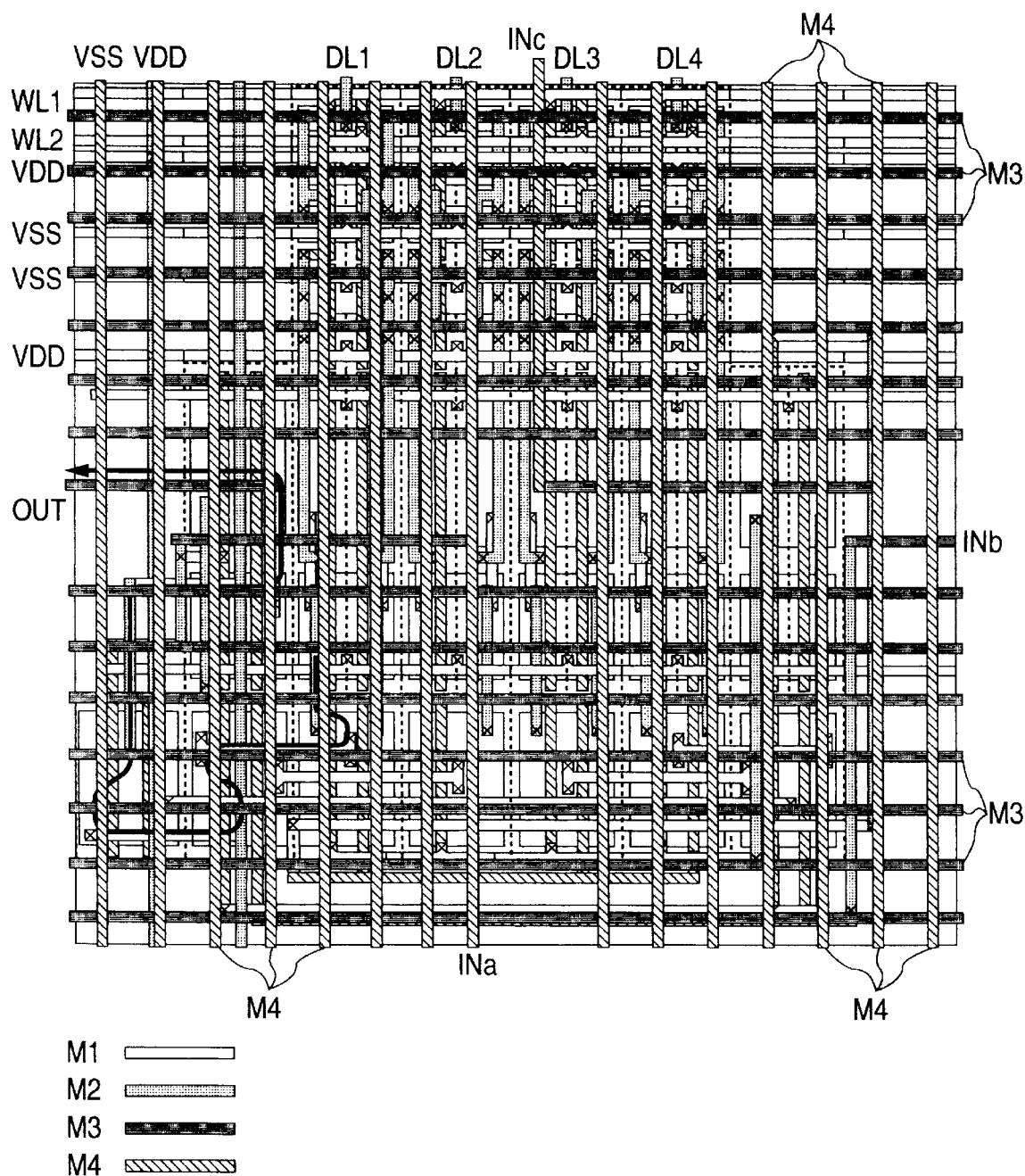
FIG. 7 is a plan view of a typical layout of a variable logic block including an aerial wiring arrangement.

FIG. 4 is a schematic view of a typical layout of the variable logic block PLB. FIG. 5A is a schematic view of a typical layout of MOS elements in the variable logic block PLB. FIG. 6 is a plan view of a more detailed layout of the variable logic block (this layout is given by supplementing that of FIG. 5A with the wiring). FIG. 7 is a plan view of a variable logic block whose layout includes an aerial wiring arrangement over regions located above the block (this layout is furnished by supplementing that of FIG. 5A with aerial wiring). The checkerboard-pattern wiring M3 and M4 in FIG. 7 constitutes the aerial wiring arrangement. The crosswise wiring M3 is formed by metal wiring in a third layer, and the lengthwise wiring M4 is constituted by metal wiring in a fourth layer. The aerial wiring arrangement composed of the wiring M3 and M4 illustratively includes lines U1, U2, R1, R2, S1, S2, L1 and L2 for interconnecting logic blocks, and lines F1 and F2 for interconnecting remotely located switch matrices, as will be described later. FIG. 5B is a partial cross-sectional view of the layout in FIG. 5A, comprising an n-channel MOSFET (nMOS) formed in a P well and a p-channel MOSFET (pMOS) formed in an N well. As shown in FIG. 5B, the n-channel MOSFET (nMOS) is made up of a pair of source-drain regions S/D formed in the P well of the semiconductor substrate SUB, a gate electrode G formed on the semiconductor substrate SUB, and a gate oxide film I formed between the gate electrode G and the semiconductor substrate SUB. The p-channel MOSFET (PMOS) is constituted by a pair of source-drain regions S/D formed in the N well of the semiconductor substrate SUB, a gate electrode G formed on the semiconductor substrate SUB, and a gate oxide film I formed between the gate electrode G and the semiconductor substrate SUB. The p-channel MOSFET (PMOS) and n-channel MOSFET (nMOS) are each formed in an active region delimited by an insulating film L for insulating elements.

Reference characters VDD and VSS denote power supply lines. The power supply line VDD illustratively carries a supply voltage of 3 to 5 V and the line VSS illustratively bears a reference voltage of 0 V which is lower than the supply voltage. As depicted in FIG. 6, the variable logic block PLB has its circuits wired and constituted by a first and a second metal wiring layer M1 and M2, to be described later. With this embodiment, each variable logic block PLB receives three input signals INa, INb and INc through three input terminals, one on top, another on the right, and another at the bottom in FIG. 6. The first and second metal wiring layers M1 and M2 constitute a lower wiring layer in the multiple wiring layer setup.

On the left-hand side of the variable logic block PLB is an output terminal OUT through which a signal reflecting the result of the logic operation is output. The input and output terminals (INa, INb, INc and OUT) are connected via the wiring M3 and M4 to the variable logic block PLB whose circuits are wired and constituted by the wiring M1 and M2. In this manner, each variable logic block PLB of the embodiment receives input signals arriving in three directions, and outputs in one direction the result of the logic operation on these signals. It should be noted that the directions in which the input signals arrive and the direction in which the output signal is sent are not limited to those shown in FIG. 6. Alternatively, the variable logic block PLB may have a top, a bottom, a left-hand and a right-hand output terminal through which the signal representing the result of the logic operation may be output in four directions. The third and the fourth metal wiring layers M3 and M4 constitute the upper wiring layer in the multiple wiring layer setup.

In the layout of FIG. 6, the word lines WL1 and WL2 as well as the crosswise power supply lines VDD and VSS are formed by the first metal wiring layer M1. The data lines DL1 through DL4 as well as the lengthwise power supply lines VDD and VSS are composed of the second metal wiring layer M2. Of the lines connected to the I/O terminals (INa, INb, INc and OUT), those arranged crosswise are formed by the third metal wiring layer M3, and the lengthwise lines shown hatched are formed by the fourth metal wiring layer M4. In FIG. 6, reference characters Dout indicate a path through which to output a signal representing the data read from the memory cell MC1 shown in FIG. 2A. The output of the memory cell MC1 corresponds to Mout in FIGS. 8A and 8B, to be described later.

Figure 8A:
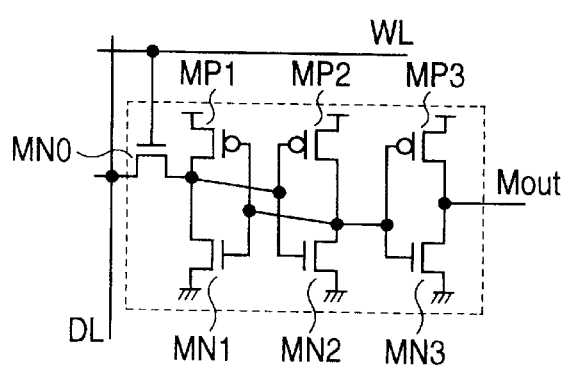
FIGS. 8A, 8B and 8C are plan views illustrating typical layouts of memory cells constituting a variable logic block.
Figure 8C:
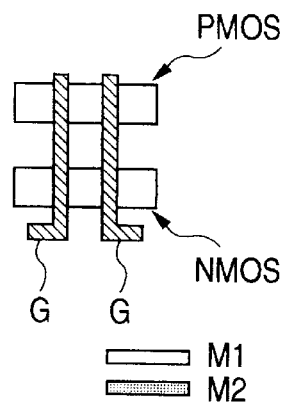
Figure 8B:
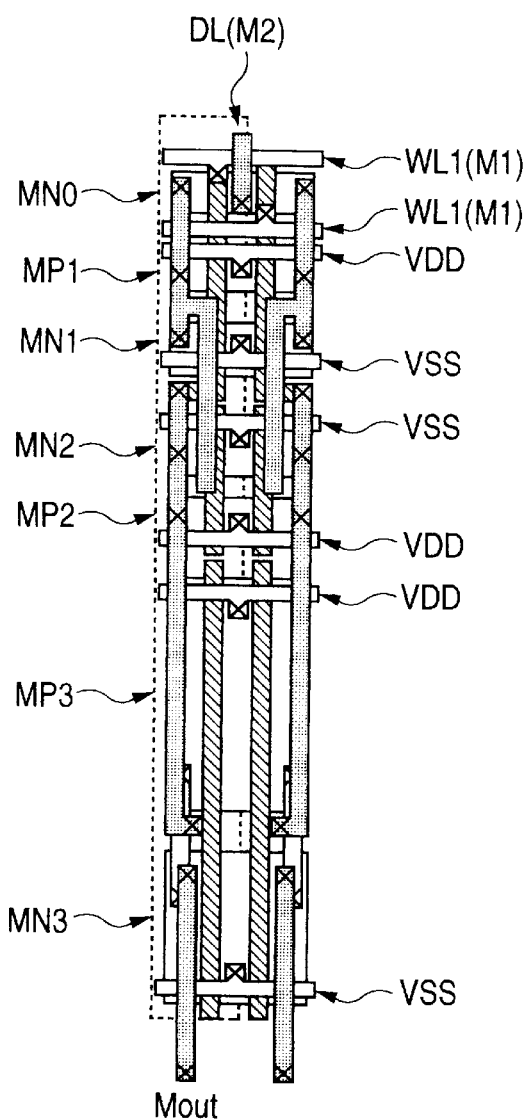

FIG. 8B illustrates a pair of memory cells MC taken out of the variable logic block PLB of FIG. 6, structured as shown in FIG. 2B, and laid out so as to correspond with M1 and M2. In the logic block, as depicted in FIG. 5A, the memory cell MC1 is paired with the memory cell MC2, MC3 with MC4, MC5 with MC6, and MC7 with MC8. In FIG. 8B, one memory cell MC is shown as a region surrounded by broken lines. FIG. 8A illustrates an equivalent circuit of the setup in FIG. 8B. As shown in FIGS. 5A and 8B, the paired memory cells MC are laid out in a horizontally symmetrical manner. Of the elements constituting the memory cell MC, the element designated by characters MN0 is a selecting n-channel MOSFET Qs (nMOS), those indicated by MP1 and MP2 are p-channel MOSFETs (PMOS) forming a latch circuit LT, those denoted by MN1 and MN2 are n-channel MOSFETs (nMOS) forming the latch circuit LT, and those identified by MP3 and MN3 are a p-channel MOSFET (pMOS) and an n-channel MOSFET (nMOS) constituting the output inverter INV0. The output of the output inverter INV0 is identified as Mout. As shown in FIGS. 8B and 8C, the hatched elements make up a polysilicon layer forming the gate electrodes G of the MOSFETs. The polysilicon layer is connected to the word lines WL1 and WL2 composed of the wiring M1. The source-drain regions S/D of each MOSFET are made up of a diffusion layer formed in the semiconductor substrate. Because the paired memory cells MC are connected to the same data line DL, the selecting MOSFET Qs and the MOSFET NM0 have a common diffusion layer. Likewise, the MOSFETs MN1, MN2, MN3, MP1, MP2 and MP3 share a common diffusion layer to which the power supply lines are connected. The MOSFETs MN1, MN2, MN3, MP1, MP2 and MP3 are interconnected by the wiring layers M1 and M2. As shown in FIG. 6, the memory cells MC1 through MC8 as well as the inverters INV1 through INV4 are interconnected by the wiring layers M1 and M2, whereby the variable logic block PLB is formed. Furthermore, as depicted in FIGS. 5A and 5B, each n-channel MOSFET (nMOS) is formed in the P well and each n-channel MOSFET (nMOS) in the N well. In this manner, the variable logic block PLB has its circuits wired and constituted by the wiring layers M1 and M2 which make up the lower layer in the multiple wiring layer setup.

Figure 9:
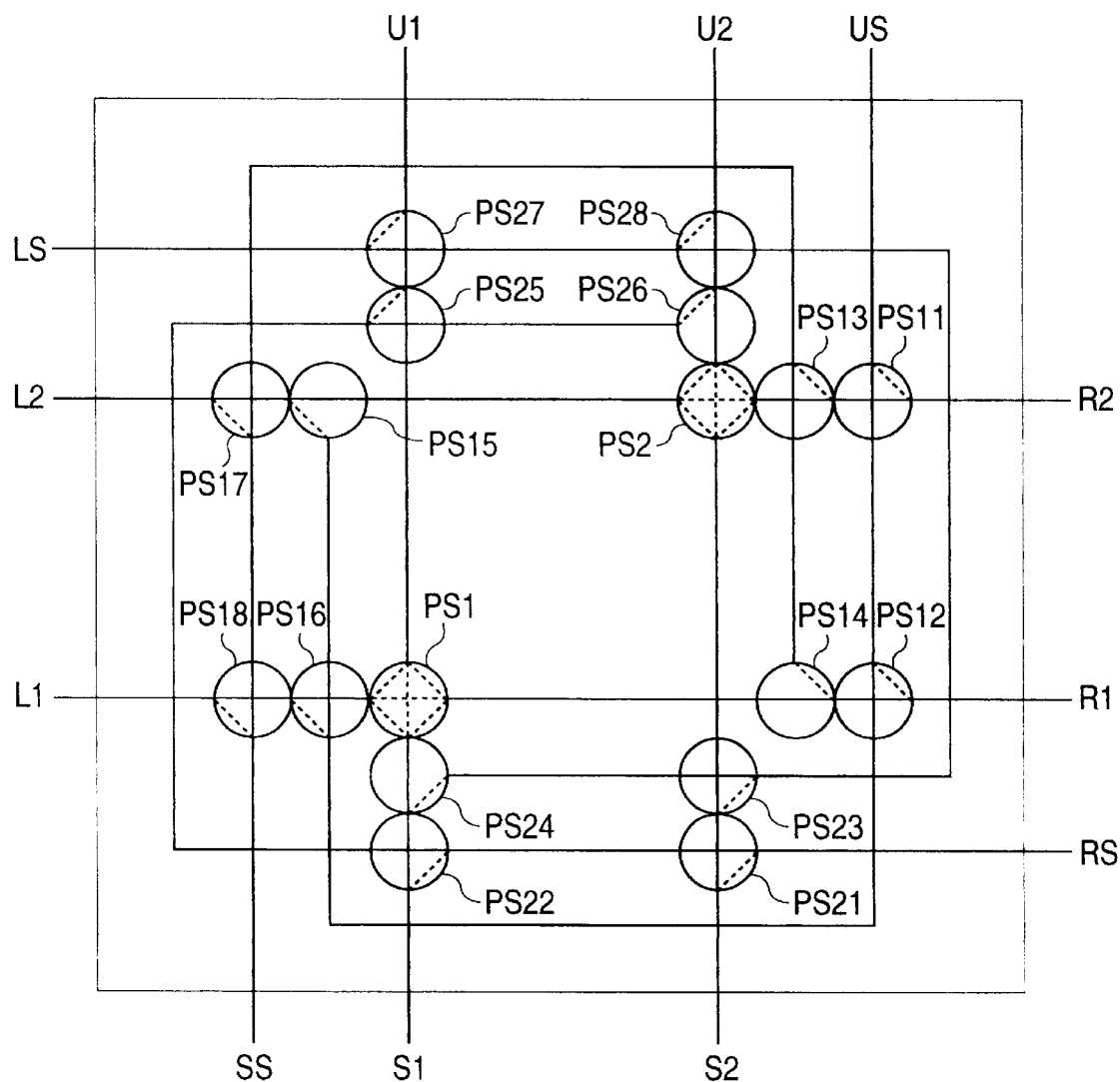
FIG. 9 is a circuit diagram of a typical switch matrix constituting part of the programmable logic LSI.

A typical switch matrix SMX will now be described with reference to FIGS. 9 through 13. FIG. 9 conceptually depicts a representative switch matrix constituting part of the programmable logic LSI. With this switch matrix, the I/O lines US, RS, SS and LS have their ends at one side connected to the I/O terminals of contiguous variable logic blocks PLB, and extend from the sides of the matrix into its interior. In the crosswise and lengthwise directions in FIG. 9, the lines U1, U2, R1, R2, S1, S2, L1 and L2, two of which extend from each matrix side to the interior, are used to interconnect the logic blocks flanking the switch matrix in question. The I/O lines US, RS, SS and LS constitute the wiring for connecting the switch matrix SMX to variable logic blocks PLB. The lines L1, L2, R1, R2, LS and RS are formed by the wiring layer M3, an upper layer in the multiple wiring layer setup. The lines U1, U2, S1, S2, SS and US are made up of the wiring layer M4, another upper layer in the multiple wiring layer setup. As will be described later with reference to FIG. 16, the lines L1, L2, R1 and R2 for interconnecting logic blocks PLB extend above logic blocks in the X direction, and the lines U1, U2, S1 and S2 also for interconnecting logic blocks PLB extend above logic blocks in the Y direction. It is through the switch matrix SMX that the lines for interconnecting variable logic blocks PLB are connected to one another as well as to logic blocks.

Figure 10:
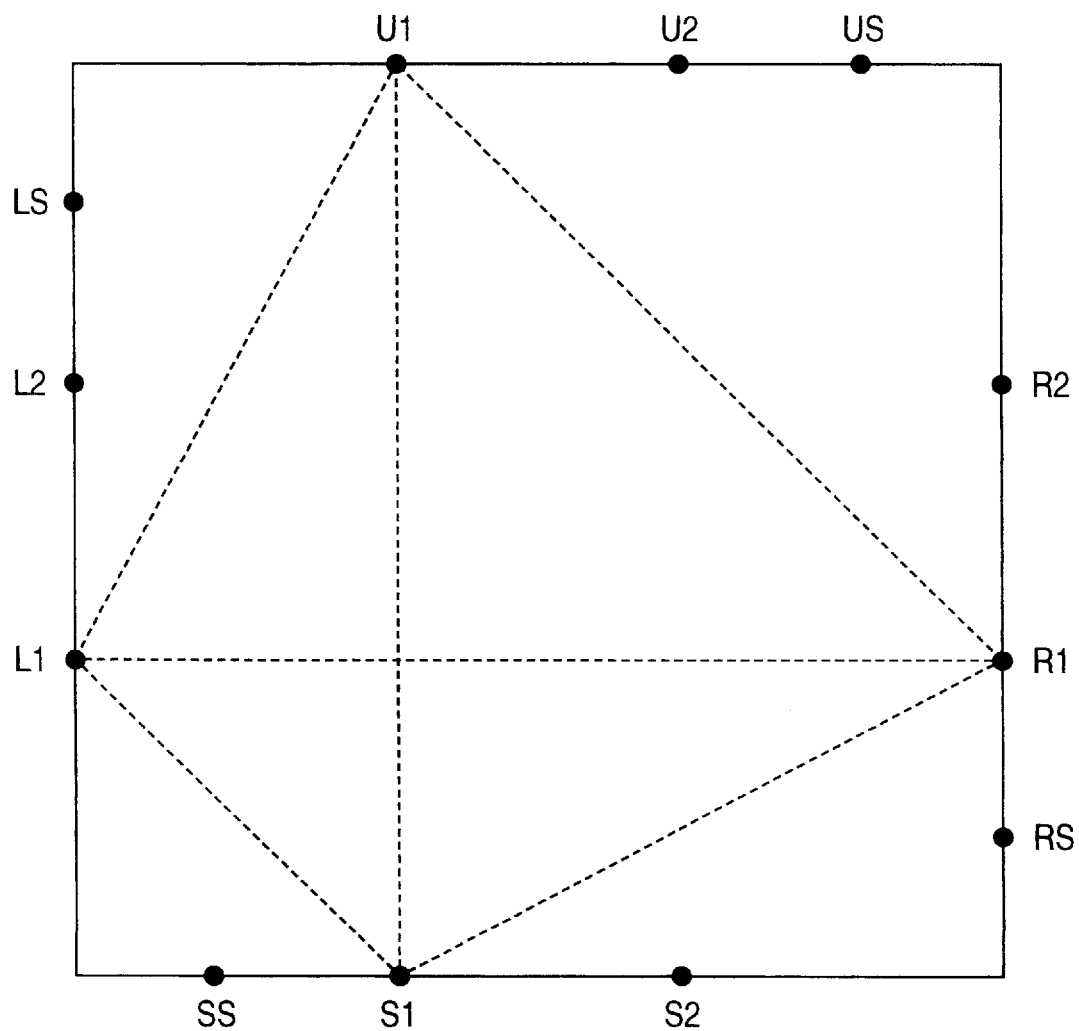
FIG. 10 is a circuit diagram showing an example of connections in the switch matrix of FIG. 9.
Figure 11:
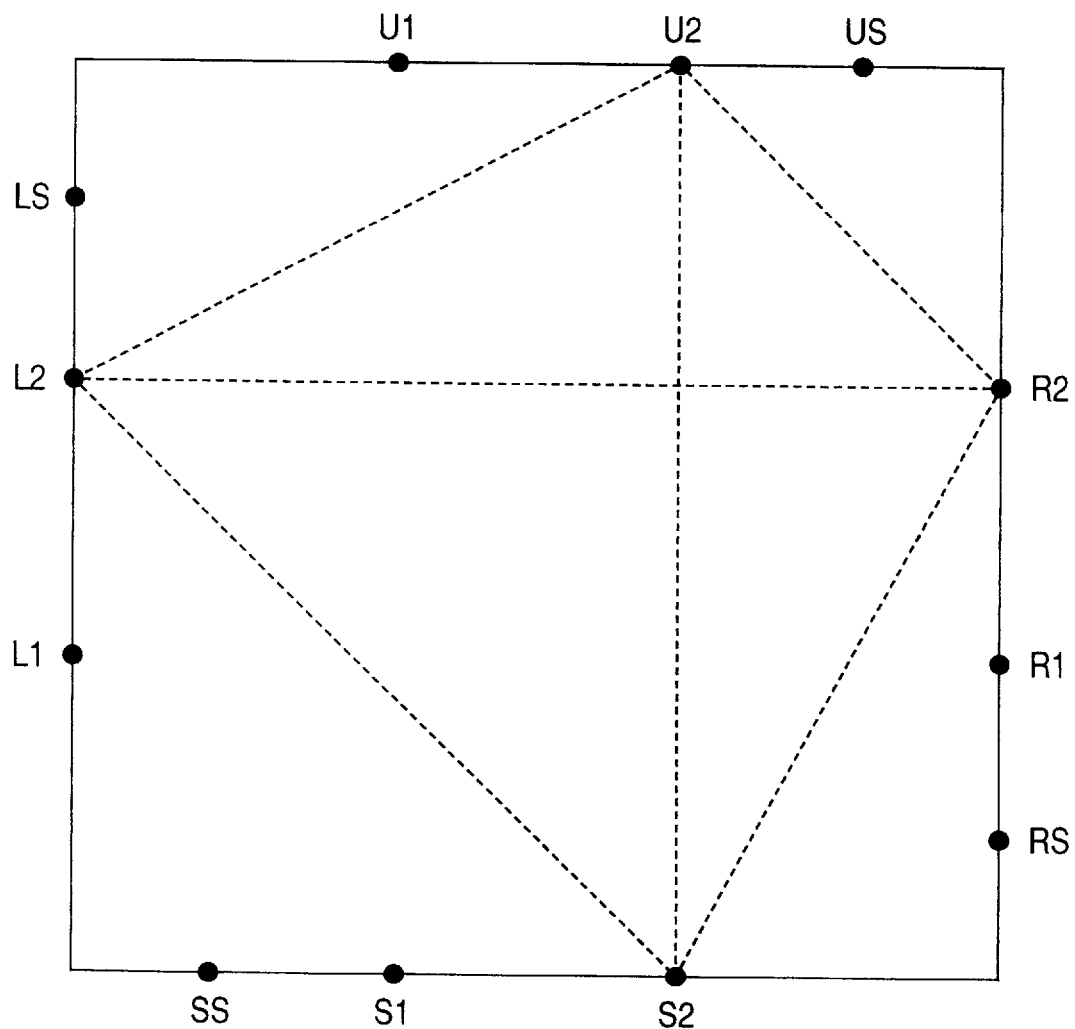
FIG. 11 is a circuit diagram depicting another example of connections in the switch matrix of FIG. 9.

A path switch PS1 is located at the point where the lines U1, R1, S1 and L1 for interconnecting logic blocks intersect, and a path switch PS2 is located at the point where the lines U2, R2, S2 and L2 for logic block interconnection intersect. Each path switch is designed selectively to connect any of the lines intersecting therethrough. As shown in FIG. 10, the path switch PS1 permits connection (indicated in broken line) of any two of the lines U1, R1, S1 and L1. The connection, as will be described later, is selected or canceled by setting to "1" or "0" the appropriate memory cells in the path switch PS1. The path switch PS2 permits connection (broken line) of any two of the lines U2, R2, S2 and L2, as depicted in FIG. 11.

Figure 12:
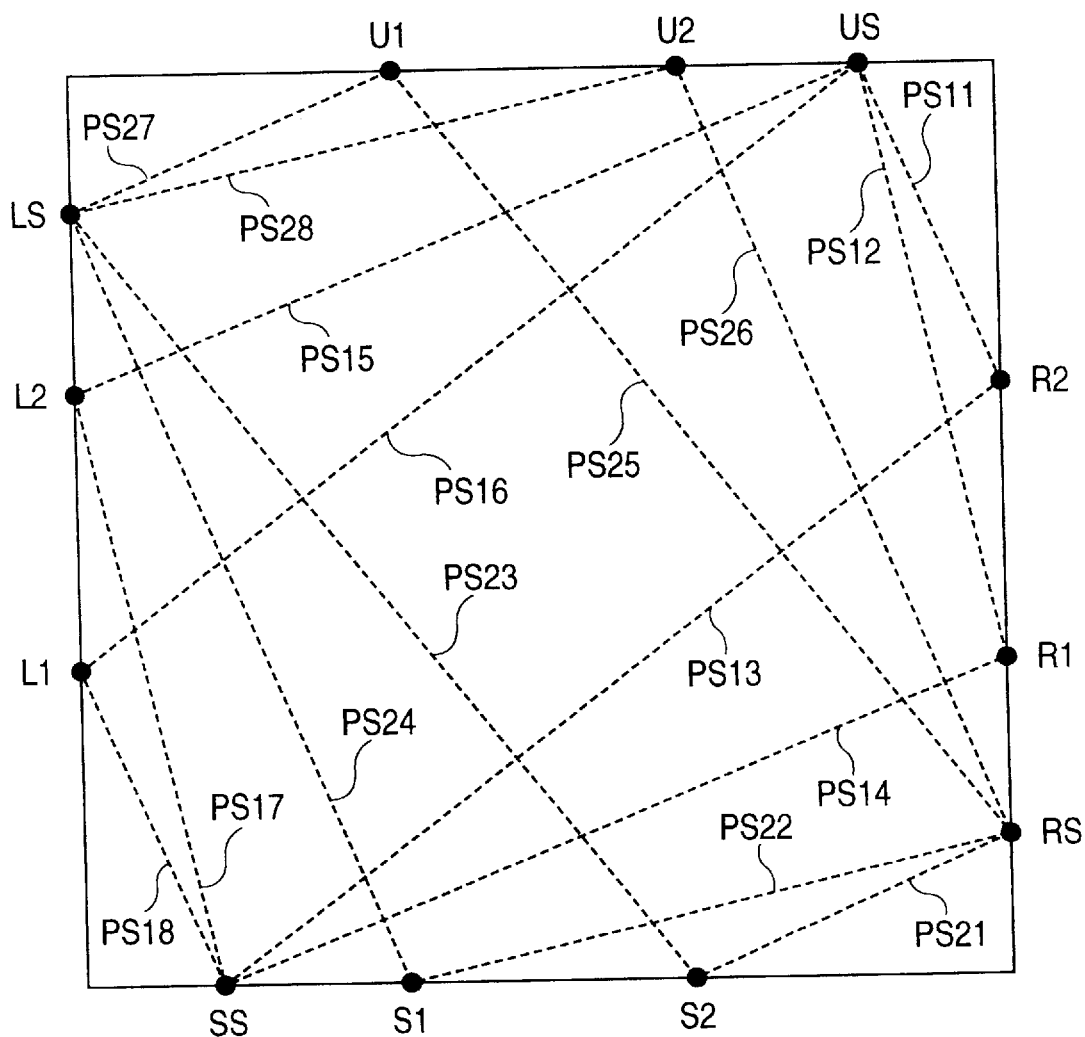
FIG. 12 is a circuit diagram indicating a further example of connections in the switch matrix of FIG. 9.
Figure 13:
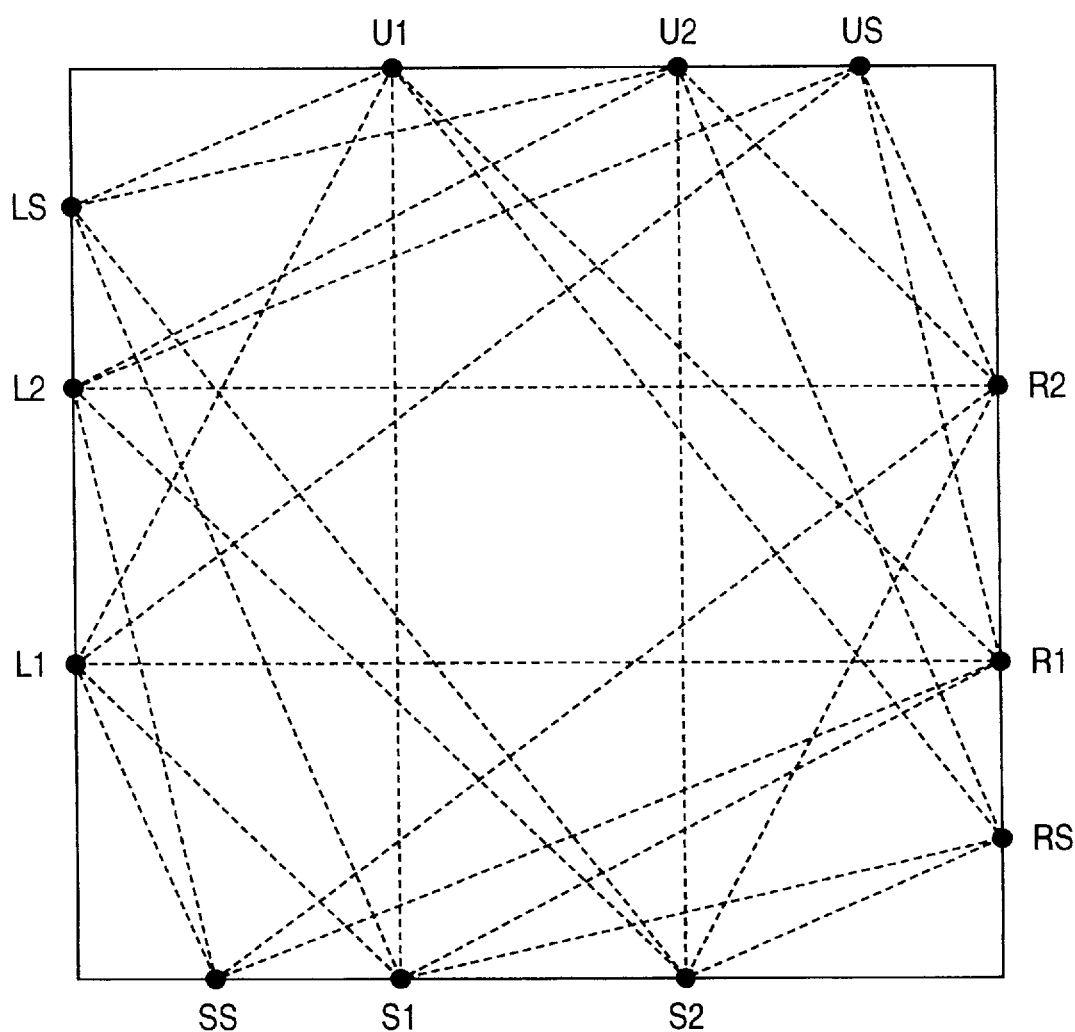
FIG. 13 is a circuit diagram illustrating a yet further example of connections in the switch matrix of FIG. 9.

As shown in FIGS. 9 and 12, path switches PS11 and PS12 are provided at the points where the I/O line US and the logic block interconnecting lines R2 and R1 intersect, and path switches PS13 and PS14 are furnished at the points where the I/O line SS and the logic block interconnecting lines R2 and R1 intersect. Likewise, path switches PS15 and PS16 are set up at the points where the I/O line US and the lines L2 and L1 for logic block interconnection intersect, and path switches PS17 and PS18 are established at the points where the I/O line SS and the logic block interconnecting lines L2 and L1 intersect. Furthermore, path switches PS21, PS22, PS23 and PS24 are provided at the points where the I/O line RS and the logic block interconnecting lines S2, S1, U2 and U1 intersect, and path switches PS25, PS26, PS27 and PS28 are furnished at the points where the I/O line LS and the logic block interconnecting lines S2, S1, U1 and U2 intersect. The connections shown in FIG. 9 do not represent the actual appearance of the wiring but indicate the wiring pattern in an abstract manner so as to highlight the lines on which the path switches are furnished. FIG. 13 shows paths that are selectively connectable through the above-mentioned path switches PS.

Figure 14A:
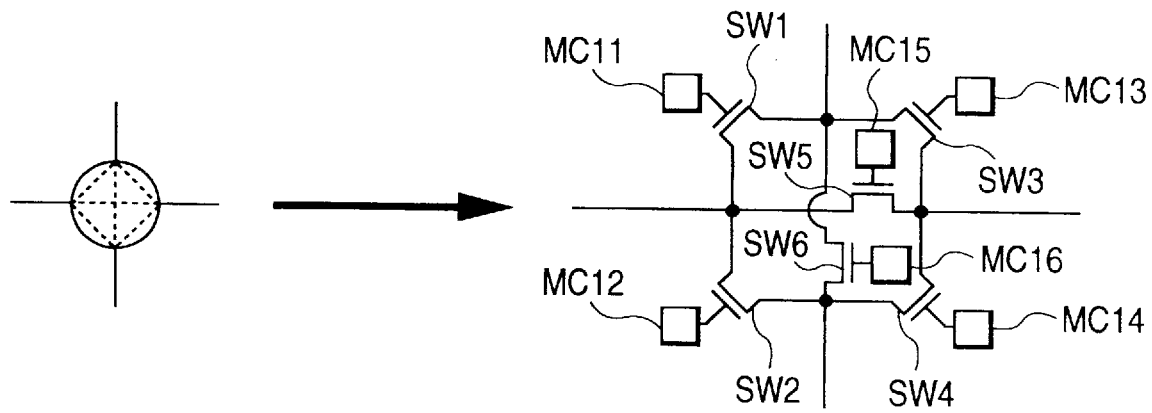
FIGS. 14A, 14B and 14C are circuit diagrams of typical path switches constituting part of the switch matrix of FIG. 9.
Figure 14B:
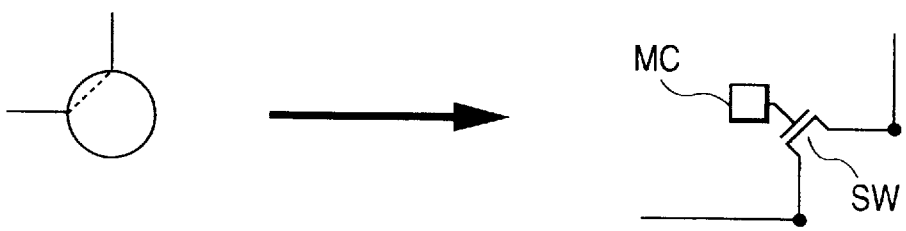
Figure 14C:
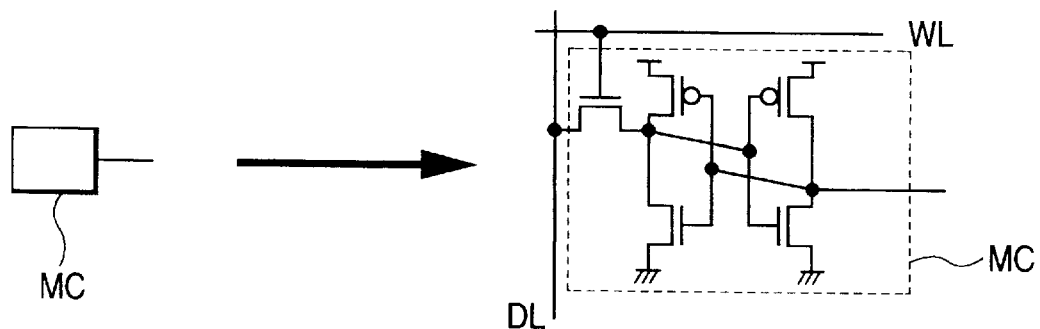

Of the path switches PS, some permit a connection in one direction only; others permit connections in six directions. FIGS. 14A, 14B and 14C depict typical structures of the path switch PS. Shown in FIG. 14A is a path switch which permits connections in six directions, the switch being located at the intersection point of logic block interconnecting lines. This path switch is made up of six switches MOSFET SW1 through MOSFET SW6 interposed between four perpendicularly intersecting signal lines and of six memory cells MC11 through MC16 connected to the gates of the switches. Of the path switches in FIG. 9, PS1 and PS2 have the same structure as the path switch in FIG. 14A. The other path switches each permit a connection in one direction only. As illustrated in FIG. 14B, this type of path switch is composed of a switch MOSFET SW interposed between two perpendicularly intersecting signal lines and of a memory cell connected to the gate of the switch. As evident in FIG. 9, each switch matrix SMX of this embodiment has 28 switches MOSFET SW1 through MOSFET SW6 and SW as well as 28 memory cells MC. Each of the switches MOSFET SW1 through MOSFET SW6 and MOSFET SW is formed by an n-channel MOSFET MN3, as will be described later with reference to FIGS. 19 through 24.

The memory cells MC11 through MC16 (see FIG. 14C) are substantially the same in structure as the memory cells used in the variable logic blocks PLB (see FIG. 3). The difference is that the memory cells MC11 through MC16 have no output inverters INV0.

When data is written to any one of the memory cells MC11 through MC16 in the path switch PS at a given intersection point of the wiring lines, the switch MOSFET corresponding to the memory cell that has received the data is turned on. This causes a signal to be transmitted through the path switch in the allowed direction (or directions). The switch matrices SMX are wired and constituted into a circuit by the lower wiring layers M1 and M2, as will be described later with reference to FIGS. 19 through 24.

Figure 15:
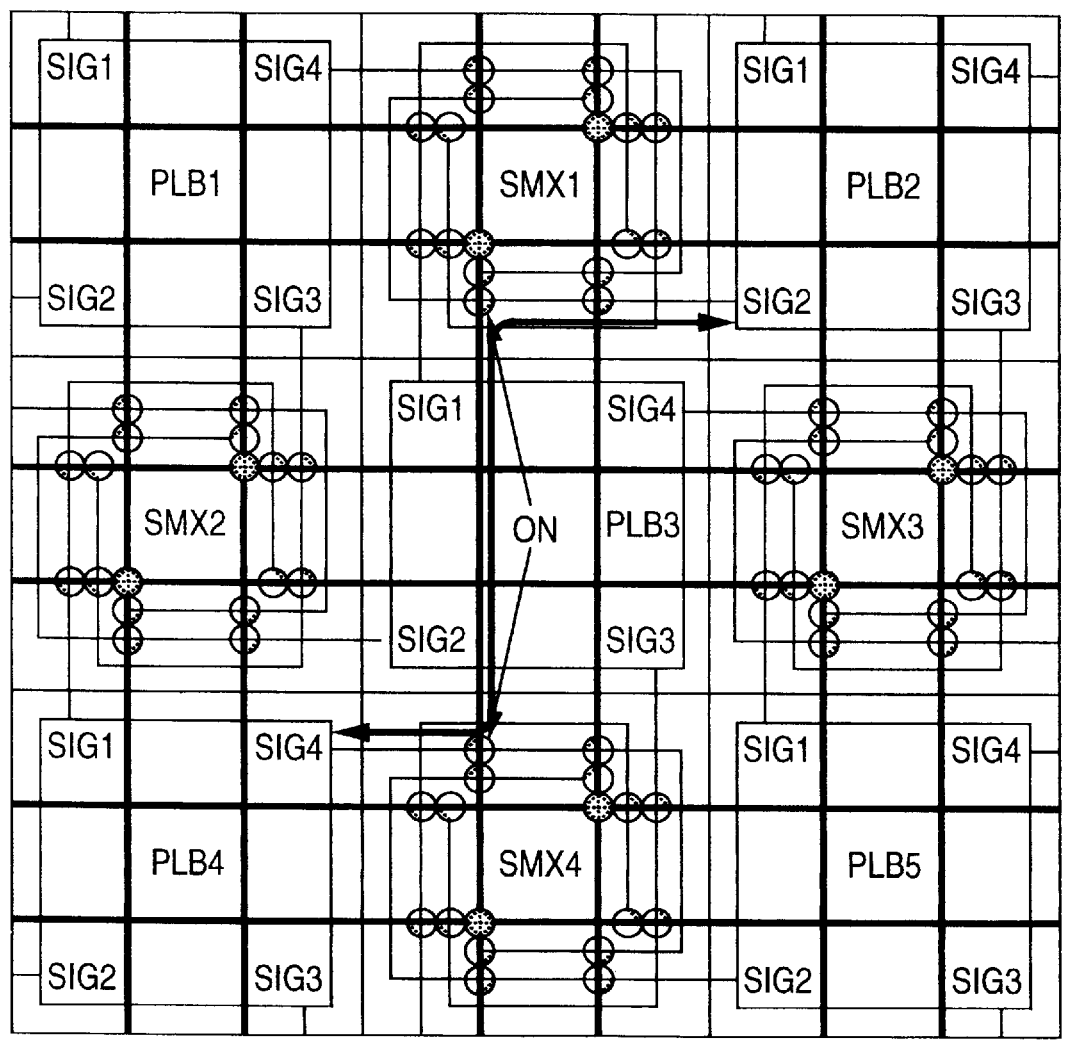
FIG. 15 is a circuit diagram showing how switch matrices and variable logic blocks are illustratively connected.
Figure 16:
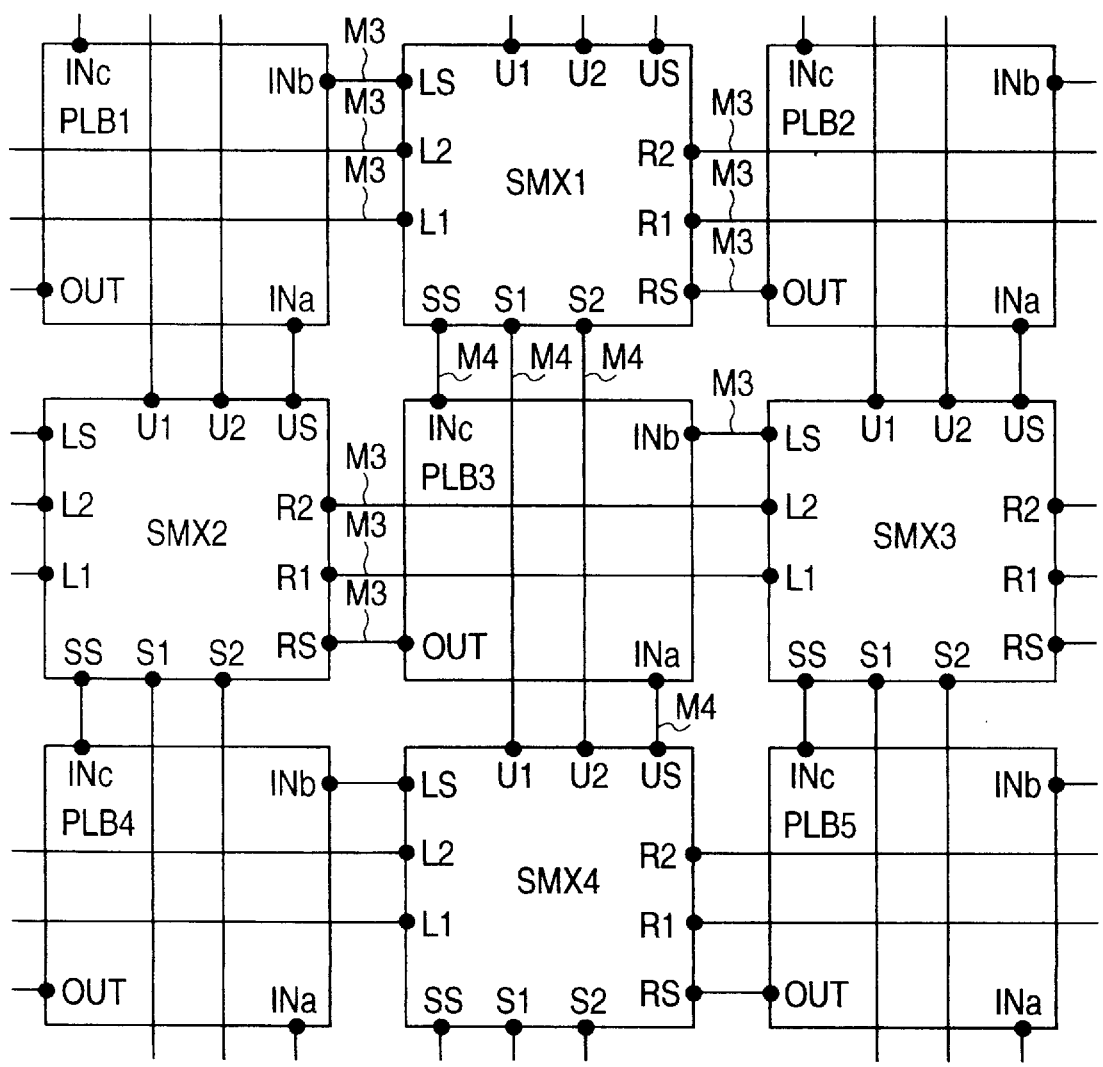
FIG. 16 is a circuit diagram depicting how the I/O terminals of switch matrices and those of variable logic blocks are illustratively connected.

FIG. 15 shows how variable logic blocks PLB and switch matrices SMX are illustratively connected as part of the checkerboard-pattern array corresponding to the setup in FIG. 1B. FIG. 16 is a circuit diagram depicting how the I/O terminals (INa, INb, INc and INd) of the variable logic blocks PLB and those of the switch matrices SMX in FIG. 15 are illustratively connected. The lines US, RS, SS, LS, U1, U2, S1, S2, R1, R2, L1 and L2 may be interconnected through the path switches PS as shown in FIG. 13. Basically, as depicted in FIGS. 15 and 16, the logic block interconnecting lines U1, U2, R1, R2, S1, S2, L1 and L2 of one switch matrix SMX are connected to their counterparts of another switch matrix SMX with a variable logic block PLB interposed between the two switch matrices. In that setup, if it is desired to interconnect, say, the variable logic blocks PLB2 and PLB4, appropriate data ("1" or "0") is written to the applicable memory cells so that the path switch PS22 in the switch matrix SMX2 and the path switch PS27 in the switch matrix SMX4 will be turned on. This allows the signal from the variable logic block PLB2 to be input to the variable logic block PLB4 through the two path switches alone. That is, in the X direction, the logic block interconnecting lines L1 and L2 of one switch matrix SMX extend above a variable logic block PLB to connect integrally with the logic block interconnecting lines R1 and R2 of another switch matrix SMX. Likewise, in the Y direction, the logic block interconnecting lines U1 and U2 of one switch matrix SMX extend above a variable logic block PLB to connect integrally with the logic block interconnecting lines S1 and S2 of another switch matrix SMX.

Figure 17:
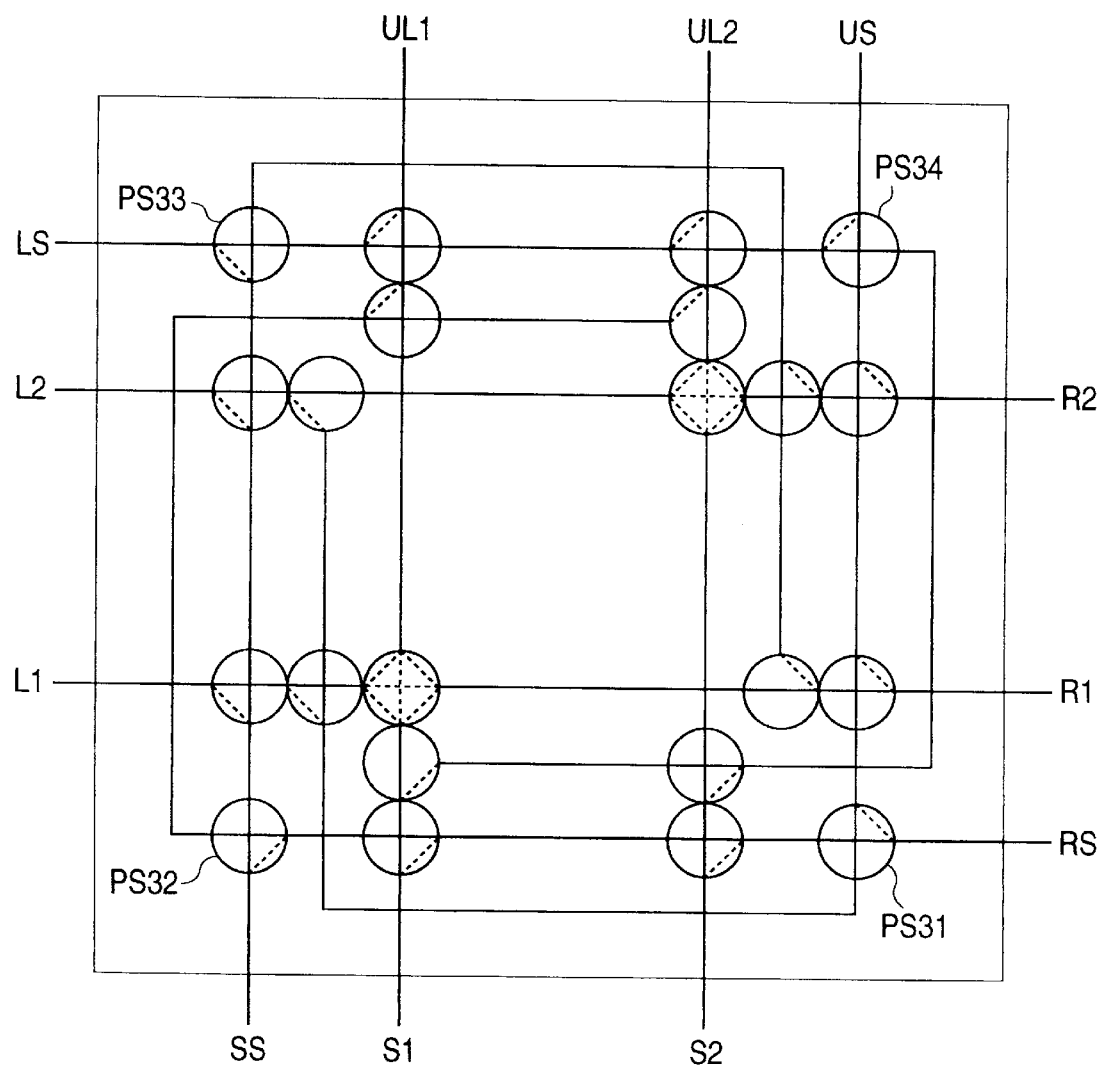
FIG. 17 is a circuit diagram of another typical switch matrix constituting part of the programmable logic LSI.
Figure 18:
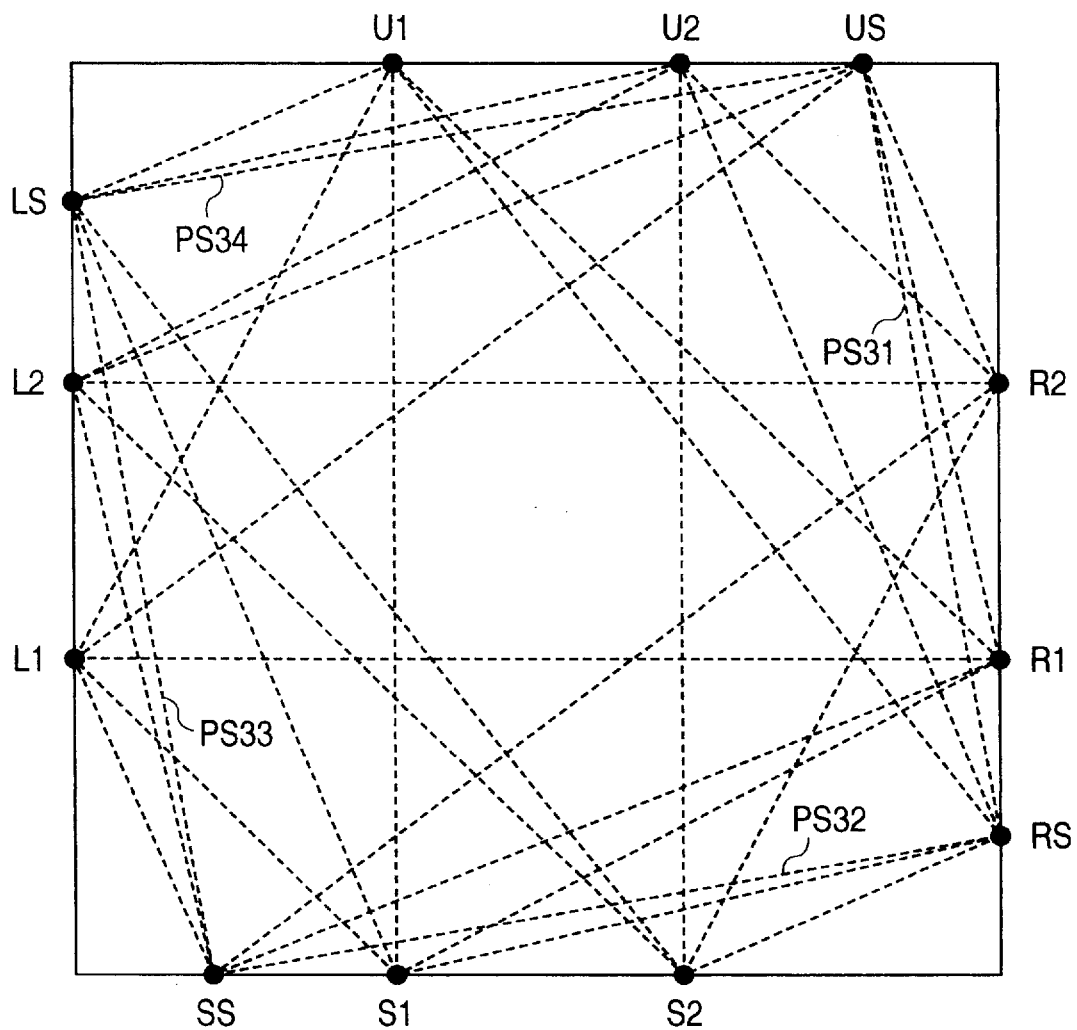
FIG. 18 is a circuit diagram showing an example of connections in the switch matrix of FIG. 17.

Alternatively, as shown in FIGS. 17 and 18, path switches PS31, PS32, PS33 and PS34 may be provided at the points where the I/O lines US, RS, SS and LS intersect, and may be used to connect contiguous logic blocks depicted in FIGS. 15 and 16. Each of the path switches PS31, PS32, PS33 and PS34 can connect, as a single switch, diagonally contiguous logic blocks. In FIG. 18, broken lines represent the paths that are selectively connectable through the path switches PS of FIG. 17. The paths (broken lines) in FIG. 18 are the same as those in FIG. 13 with the exception of the paths formed by the path switches PS31, PS32, PS33 and PS34.

Figure 20:
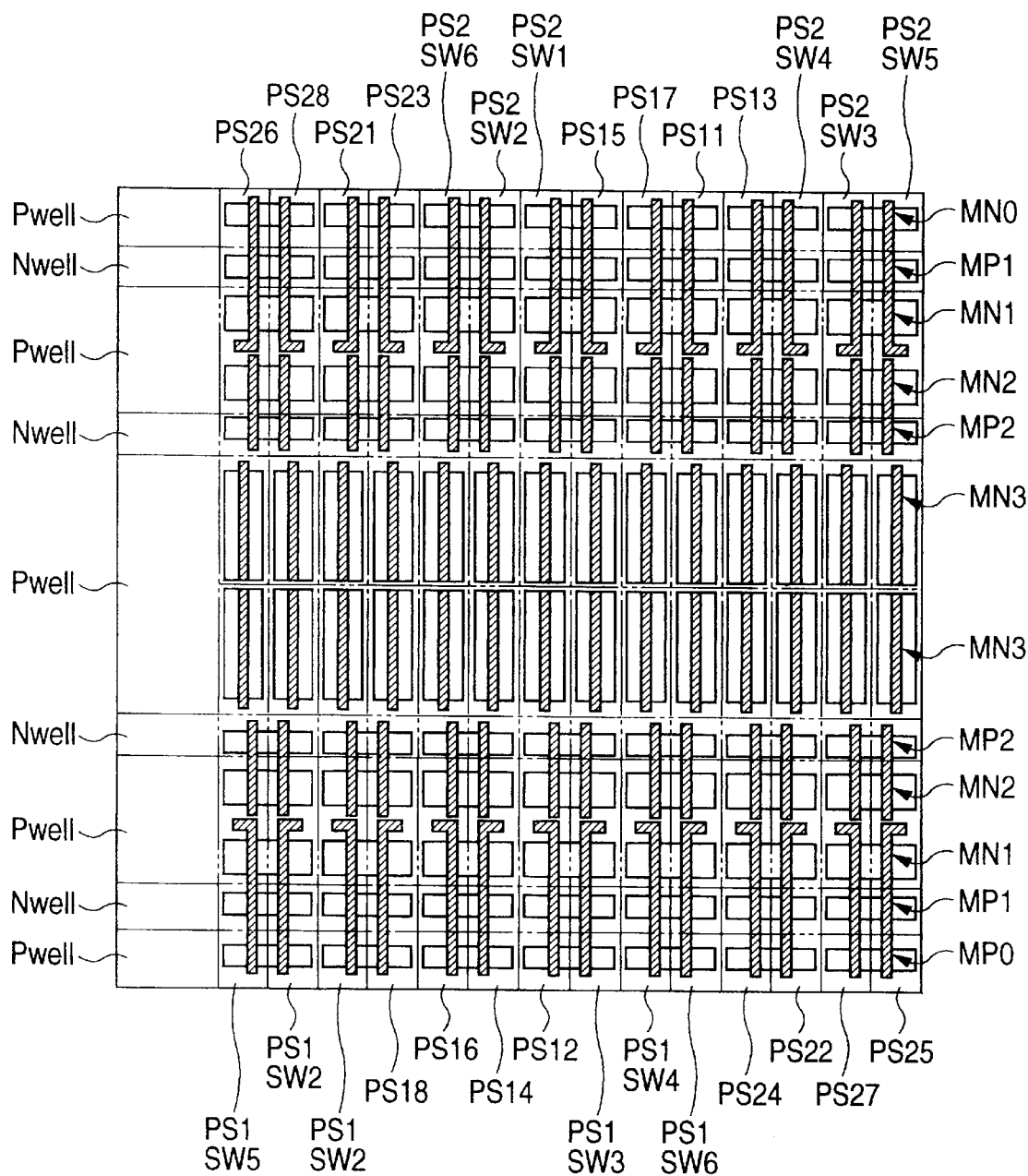
FIG. 20 is a schematic view of a typical layout of elements in the switch matrix of FIG. 17.
Figure 21:
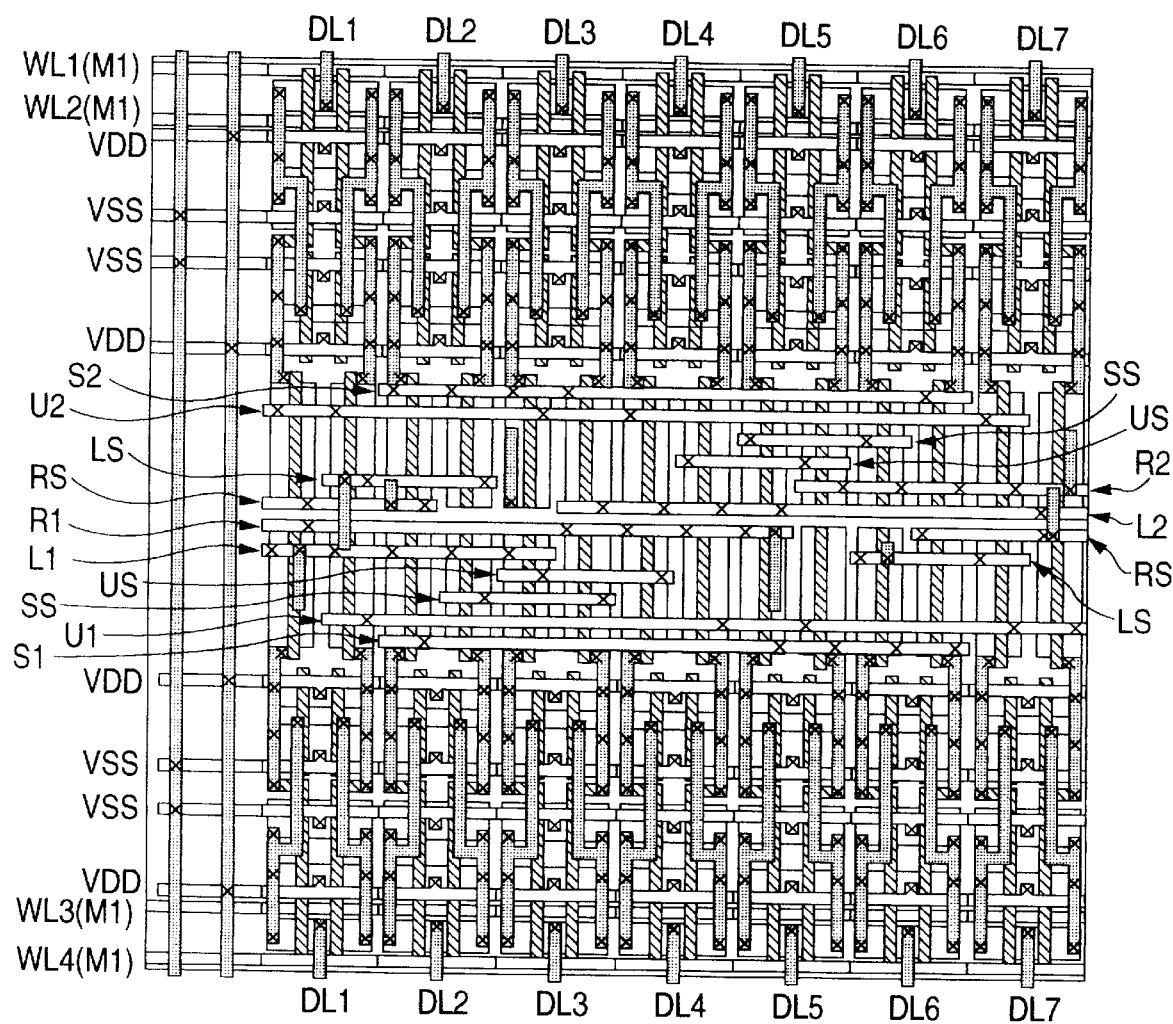
FIG. 21 is a plan view of a specific layout (down to the metal wiring forming the second layer) of a switch matrix.
Figure 22:
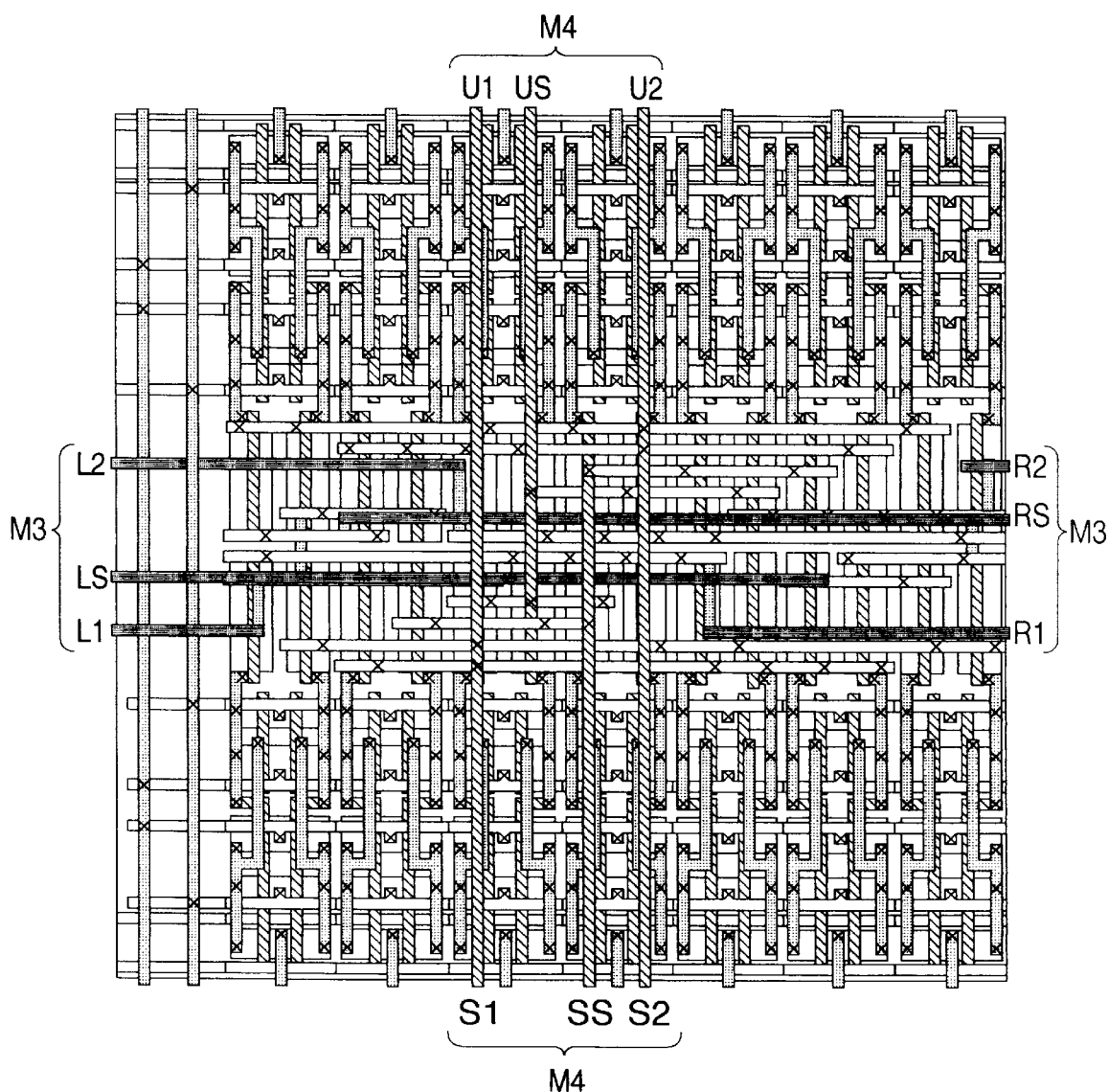
FIG. 22 is a plan view of a typical layout of a switch matrix including I/O signal lines.
Figure 23:
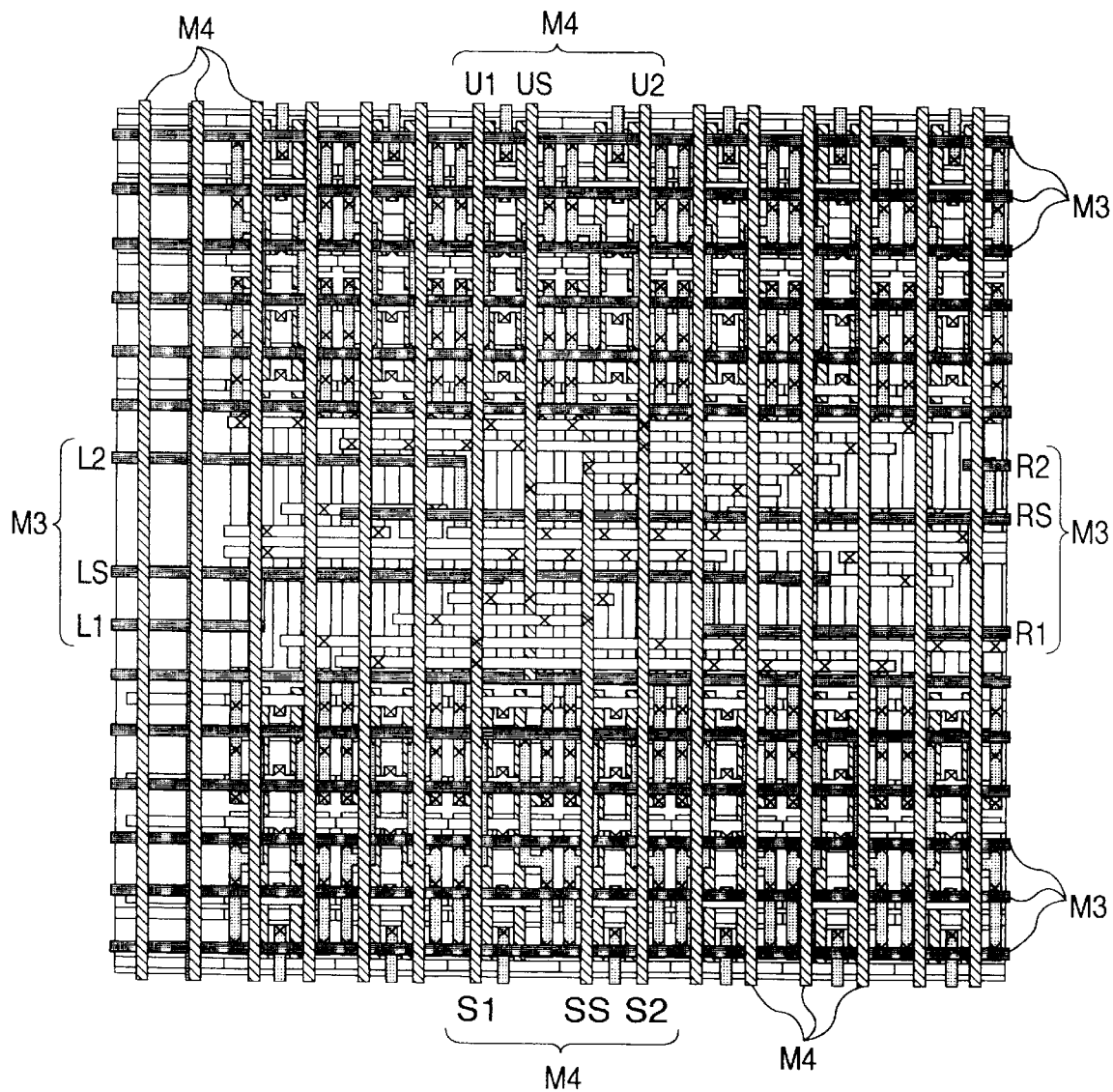
FIG. 23 is a plan view of a typical layout of a switch matrix including an aerial wiring arrangement.

FIG. 21 is a plan view of a typical layout (down to the second metal wiring layer) of the switch matrix SMX shown in FIGS. 9 and 14A through 14C. FIG. 19 is a schematic view of a typical layout of circuits in the switch matrix SMX. FIG. 20 illustrates a typical layout of MOS elements in the switch matrix SMX. FIG. 22 depicts a typical layout of the switch matrix SMX in FIG. 21 supplemented by the I/O lines US, RS, SS and LS and the logic block interconnecting lines U1, U2, R1, R2, S1, S2 and L1 and L2 which constitute the third and the fourth layers. FIG. 23 shows a typical layout of a switch matrix SMX additionally furnished with an aerial wiring arrangement.

In the layout of FIG. 21, the first metal wiring layer M1 forms the word lines WL1, WL2, WL3 and WL4 as well as the crosswise power supply lines VDD and VSS. The second metal wiring layer M2 constitutes the data lines DL1 through DL7 and the lengthwise power supply lines VDD and VSS. In the switch matrix SMX, the first and the second metal wiring layers M1 and M2 connect the memory cells CM to one another as well as to the switches MOSFET SW and MOSFET SW1 through MOSFET SW6 to form a circuit therein.

With this embodiment, as shown in FIGS. 16 and 22, the third metal wiring layer M3 forms the lines R2, RS, R1, L2, L1 and LS of FIG. 9 connected to the path switches PS, and the fourth metal wiring layer M4 constitutes the lengthwise lines U1, US, U2, S1, SS and S2. As indicated in FIG. 21, these lines are connected via internal connection lines S2 and S1 to the diffusion layer of the MOSFETs MN3 acting as path switches PS (to be described later with reference to FIG. 24). The internal connection lines S2 and S1 are formed by the first (crosswise) metal wiring layer M1 and by the second (lengthwise) metal wiring layer M2 in the middle of the switch matrix SMX.

The path switches PS shown in FIGS. 9 and 14A through 14C are connected by the wiring M1 and M2. The lines R2, RS, R1, L2, LS and L1 formed by the wiring M3 and the lines U1, US, U2, S1, SS and S2 constituted by the wiring M4 are connected via the wiring M2 and M1 to the diffusion layer of the MOSFETs MN3 acting as path switches PS (to be described later with reference to FIG. 24). Meanwhile, as depicted in FIGS. 2A, 2B and 6, the I/O lines LS, US and SS are electrically connected to the gate electrodes G of the MOSFETs Qn1 and Qp1 making up the inverters INV1 through INV3 in the variable logic block PLB. The I/O line RS is connected to the diffusion layer, i.e., the source-drain regions of the MOSFETs Qn1 and Qp1 constituting the inverter INV4 in the variable logic block PLB.

The aerial wiring arrangement extending above the switch matrices SMX has a grid pattern as shown in FIG. 23. In this wiring arrangement, the crosswise wiring M3 is formed by the third metal wiring layer M3 and the lengthwise wiring M4 is constituted by the fourth metal wiring layer M4. The aerial wiring arrangement made up of the wiring layers M3 and M4 comprises long-distance connecting lines F1 and F2 for connecting remotely located switch matrices, as will be described later.

As mentioned, each switch matrix SMX of this embodiment has 28 switches MOSFET SW and MOSFET SW1 through MOSFET SW6 (MN3) and 28 memory cells CM. As shown in FIGS. 19 through 21, 14 switches and 14 memory cells, i.e, half of the switches and memory cells, are located above and the remaining half are positioned below. Furthermore, half of the 14 memory cells MC are connected to the word line WL1 and the rest to the word line L2 in the manner illustrated in FIG. 3. The memory cells connected to the word line WL1 and those connected to the word line WL2 are attached to any one of common data lines DL1 through DL7 forming memory cell pairs.

Figure 24A:
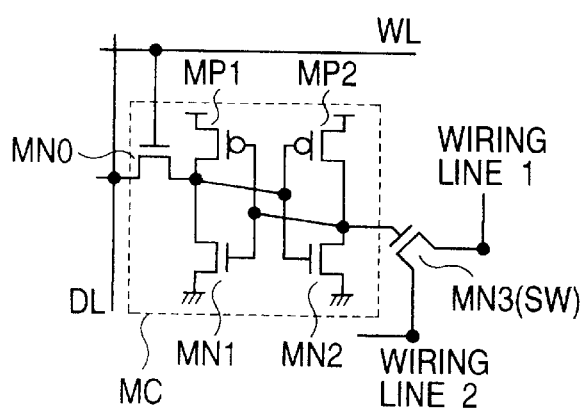
FIGS. 24A, 24B and 24C are plan views depicting typical layouts of memory cells constituting part of a switch matrix.
Figure 24B:
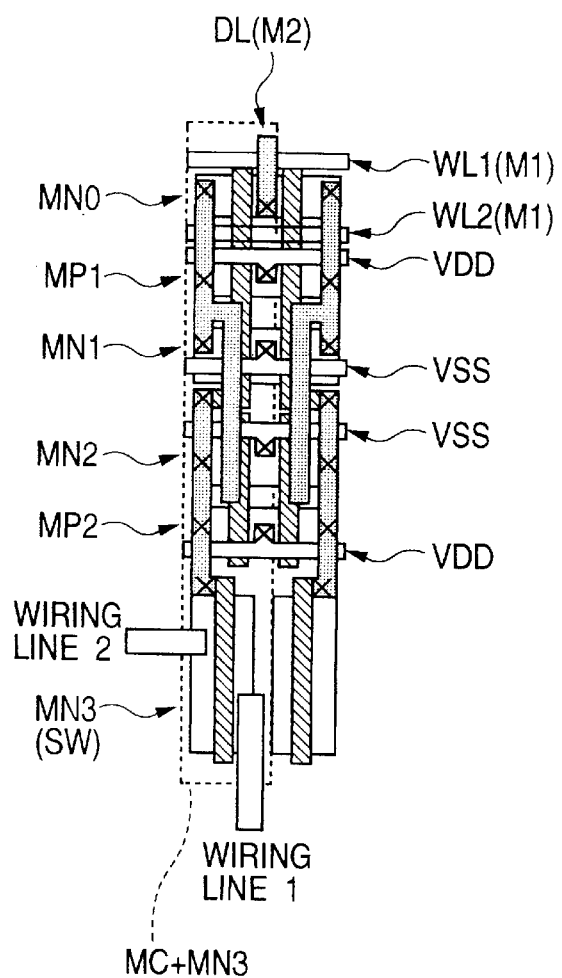
Figure 24C:
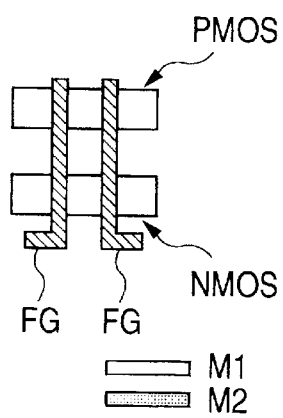

FIG. 24B presents a layout comprising one memory cell pair out of the 28 memory cells MC in pairs and two of the switches MOSFET SW and MOSFET SW1 through MOSFET SW6 (MN3) which are turned on and off by the memory cell pair. FIG. 24A portrays an equivalent circuit of the setup in FIG. 24B, including one memory cell and one of the switches MOSFET SW and MOSFET SW1 through MOSFET SW6 (MN3). The layout pattern of the paired memory cells is horizontally symmetrical, as illustrated in FIG. 24A. Of the component elements shown in FIGS. 24A and 24B, the element identified by reference characters MN0 is a selecting n-channel MOSFET Qs, those designated by MP1 and MP2 are p-channel MOSFETs forming a latch circuit LT, those denoted by MN1 and MN2 are n-channel MOSFETs constituting the latch circuit LT, and the element indicated by MN3 is an MOSFET acting as a path switch (SW, SW1 through SW6). The elements shown hatched make up the polysilicon layer comprising the gate electrodes G of the MOSFETS. Reference characters VDD and VSS represent the power supply lines.

Figure 28:
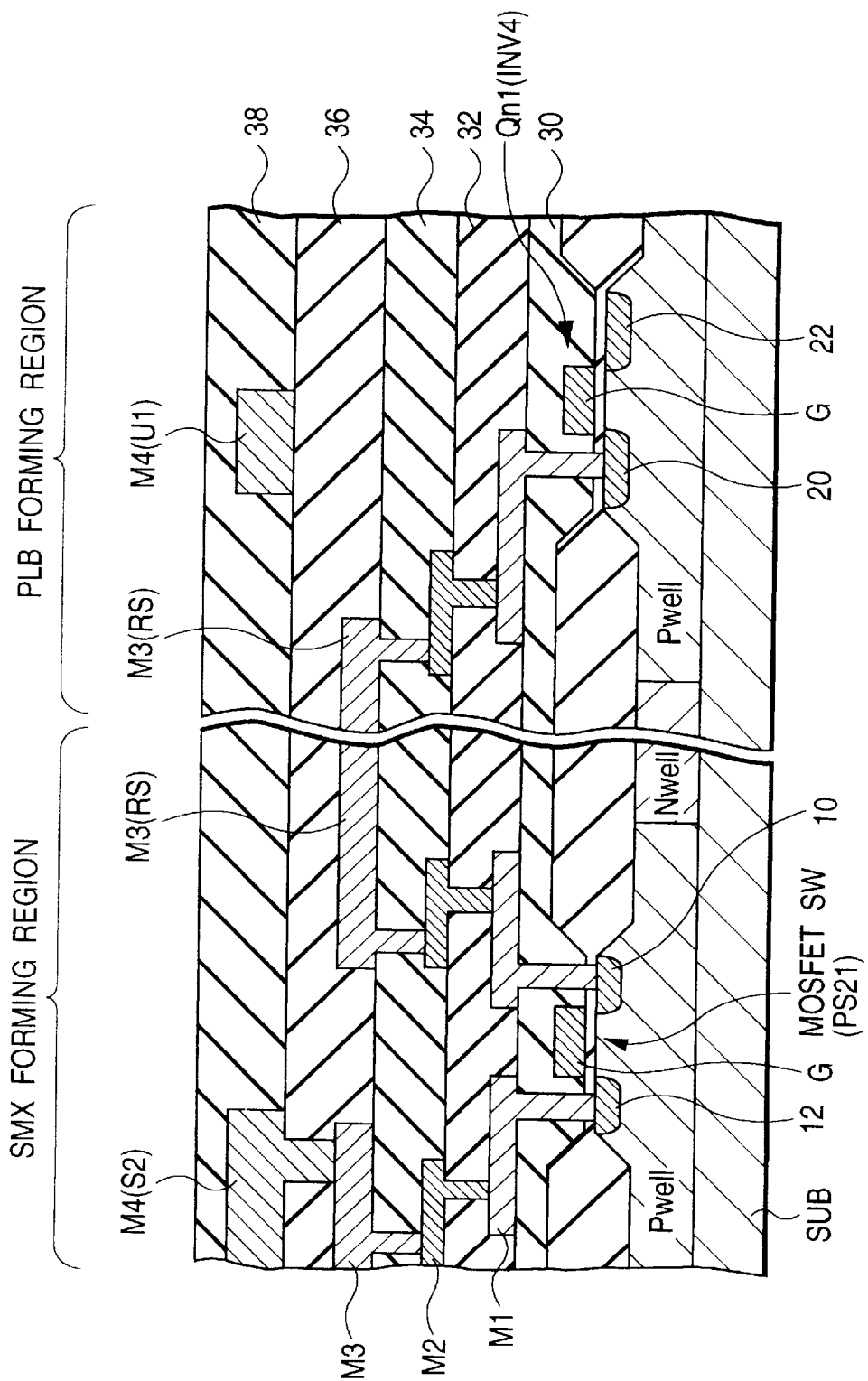
FIG. 28 is a cross-sectional view showing specific structures of a switch matrix forming region and a variable logic block forming region.

The MOSFETs Qs, MP1, MP2, MN1 and MN2, the word lines WL and the data lines DL are interconnected by the wiring M1 and M2 to form memory cells MC. The memory cells MC and the switches MOSFETs MN3 are interconnected by the wiring M1 and M2 to constitute a switch matrix. FIG. 28 is a cross-sectional view of this embodiment. On the left-hand side in FIG. 28 is a switch matrix (SMX) forming region; on the right-hand side is a variable logic block (PLB) forming region. Shown as an example in FIG. 28 is the MOSFET SW (MN3) of the path switch PS21. The source-drain regions of the switch MOSFET SW (MN3) are formed by diffusion layers 10 and 12. The diffusion layer 10 is electrically connected to the I/O line RS formed by the wiring layer M3. The diffusion layer 12 is electrically connected to the variable logic block interconnecting line S2 formed by the wiring layer M4. The I/O line RS is connected to the diffusion layer 20 of the MOSFET Qn1 constituting the inverter INV4. The diffusion layers 20 and 22 make up the source-drain regions of the MOSFET Qn1. Reference numerals 30, 32, 34, 36 and 38 represent interlayer insulating films that are formed illustratively by silicon oxide films. The wiring layers M1, M2, M3 and M4 are constituted illustratively by any combination of an aluminum alloy film, a tungsten film and a TiN film to be stacked one upon another.

When the embodiment is in operation, bringing a given word line High turns on the corresponding MOSFET Qs to supply data from the corresponding data line. This writes the desired data to the applicable memory cell (latch) thereby setting uniquely the direction in which to transmit signals between lines. Such setting of the signal transmission direction may be accomplished illustratively upon system initialization. Where the memory cells are of static type, the directions of signal transmission at each signal matrix may be changed every time initialization is carried out. This allows the logic LSI to provide diverse functions. The memory cells in which to store data for turning on or off the path switch in question are not limited to the static type (SRAM) characteristic of this embodiment. Alternatively, the FAMOS making up the EPROM, the EEPROM such as the flash memory, or fuse elements may be used instead.

What follows is a description of long-distance connecting switch matrices and the method for long-distance logic block connection using such switch matrices.

In this embodiment, the long-distance connecting switch matrices are intended to interconnect remotely located logic blocks in the semiconductor chip. The constitution of each long-distance connecting switch matrix may be the same as that of the above-mentioned switch matrix for connecting contiguous logic blocks (see FIG. 9). Alternatively, the long-distance connecting switch matrix may have a structure supplementing the path switches shown in FIG. 9 with long-distance connecting path switches. In another preferred structure, the switch matrix of FIG. 9 is used for long-distance logic block connection while the switch matrix of FIG. 17 is employed to connect contiguous or closely located logic blocks. "Remotely located" logic blocks to be connected mean logic blocks that are at least two switch matrices apart crosswise or lengthwise in the semiconductor chip.

Figure 25:
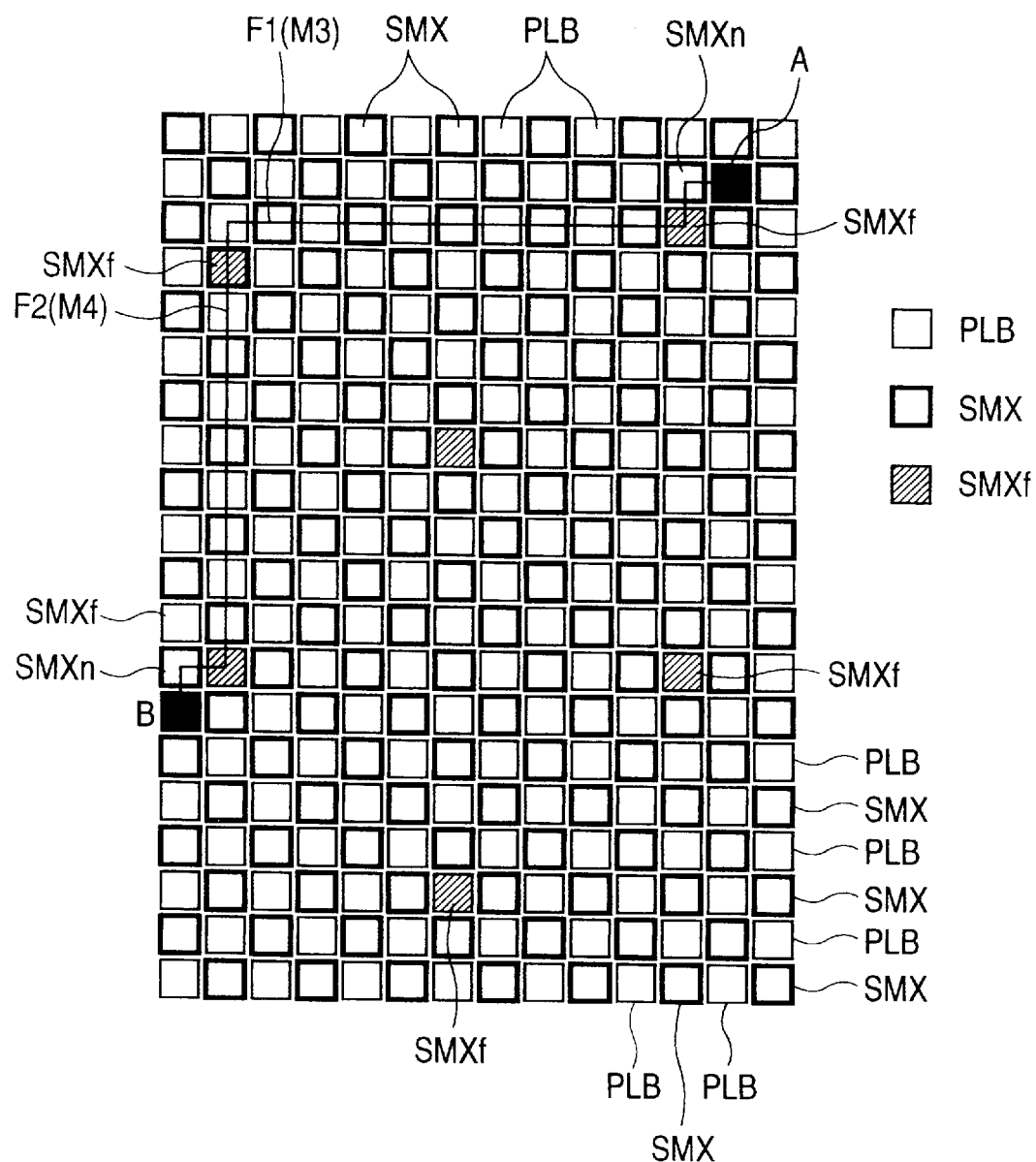
FIG. 25 is a conceptual view showing how a long-distance connection is typically established in the programmable logic LSI embodying the invention.

Described below with reference to FIG. 25 is an example in which the switch matrices whose structure is shown in FIG. 9 are used to make long- and short-distance logic block connections constituting a logic LSI. In FIG. 25, each of the squares in the matrix pattern represents either a switch matrix or a variable logic block. The switch matrices and variable logic blocks are arranged in the aforementioned checkerboard manner.

With this embodiment, the variable logic blocks in the hatched positions in FIG. 25 are replaced by long-distance connecting switch matrices SMXf. The long-distance connecting switch matrices SMXf are interconnected by dedicated lines F1 and F2 (aerial wiring) composed of the third and fourth metal wiring layers M3 and M4 above the variable logic blocks and short-distance connecting switch matrices. This means that no path switch is interposed between long-distance connecting switch matrices SMXf, which reduces the signal delay caused by path switch intervention. The wiring F1 is formed by the third metal wiring layer M3 and the wiring F2 is constituted by the fourth metal wiring layer M4.

Short-distance connecting switch matrices SMX, located one variable logic block apart as shown in FIG. 15, are interconnected by the aerial lines U1, U2, S1, S2, R1, R2, L1, L2, LS, US, RS and SS formed by the third and fourth metal wiring layers above the variable logic blocks. One long-distance connecting switch matrix SMXf and its contiguous short-distance connecting switch matrix SMX are connected illustratively by way of their matching I/O lines US, RS, SS and LS. More specifically, the I/O line US of a long-distance switch matrix SMXf is connected to the I/O line SS of its contiguous long-distance connecting switch matrix SMX. Likewise, the line RS of the switch matrix SMXf is connected to the line LS of the matrix SMX, the line SS to the line US, and the line LS to the line RS. In this connecting arrangement, the path switches in the long-distance connecting switch matrices SMXf may be selectively turned on to switch from a short-distance connection to a long-distance connection.

Below is a description of an example in which variable logic blocks A and B in FIG. 25 are connected via long-distance connecting switch matrices SMXf. First, the variable logic blocks are each connected to a short-distance connecting switch matrix SMXn which is contiguous both to the variable logic block in question and to a long-distance connecting switch matrix SMXf. Then the short-distance connecting switch matrix SMXn to which the variable logic block A has been connected is connected to the long-distance connecting switch matrix SMXf. Similarly, the variable logic block B is first connected to its contiguous short-distance switch matrix SMXn, the latter being connected to the nearest long-distance connecting switch matrix SMXf. The long-distance connecting switch matrices SMXf are then interconnected, whereby the variable logic blocks A and B are connected.

Figure 26:
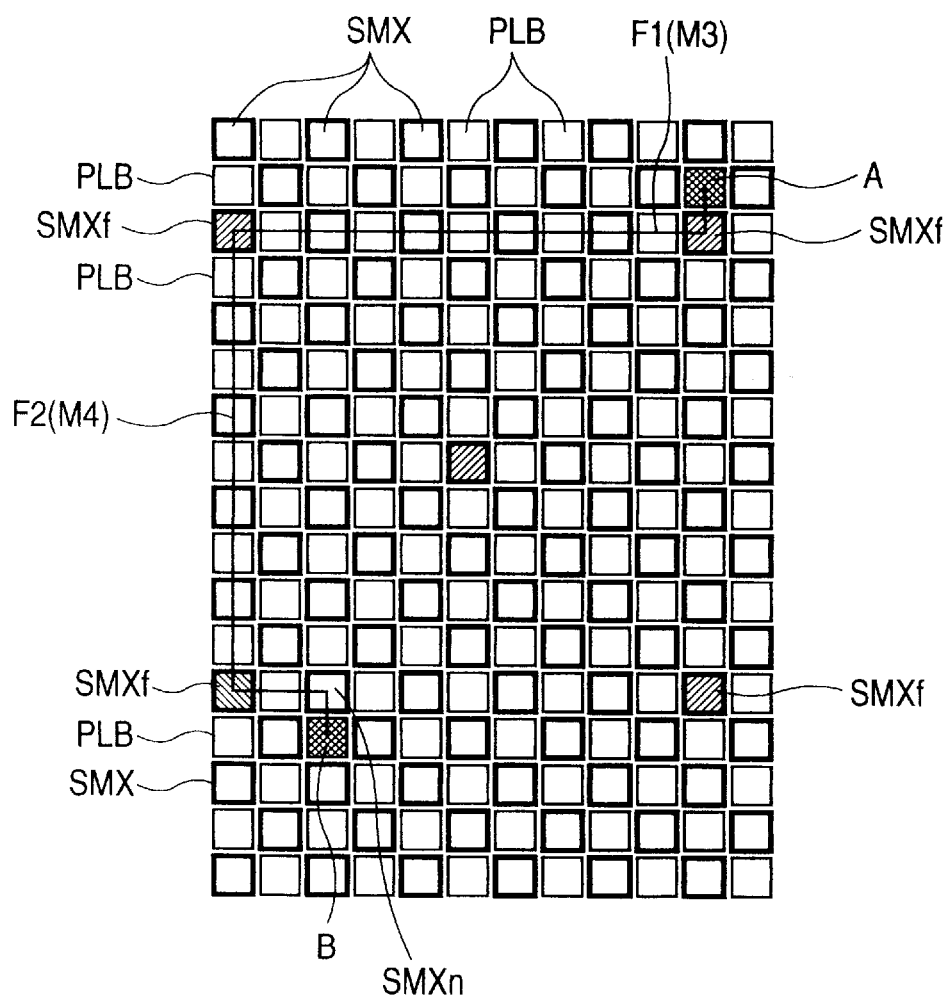
FIG. 26 is a conceptual view indicating how another long-distance connection is typically established in the programmable logic LSI.

In the above example, some variable logic blocks are replaced by long-distance connecting switch matrices. Alternatively, some short-distance connecting switch matrices may be replaced by long-distance connecting switch matrices. FIG. 26 illustrates an example of such a long-distance connection wherein the alternative switch matrix replacement is adopted.

In the example of FIG. 26, the switch matrices SMXf in the hatched block positions are used for long-distance connection purposes. Of the switch matrices, those not hatched are for short-distance connections and are interconnected one variable logic block apart by the aerial lines U1, U2, S1, S2, R1, R2, L1, L2, LS, US, RS and SS formed by the third and fourth metal wiring layers M3 and M4 above the variable logic blocks.

The long-distance connecting switch matrices SMXf are interconnected by the aerial wiring F1 and F2 formed by the third and fourth metal wiring layers M3 and M4 above the variable logic blocks and short-distance connecting switch matrices. This arrangement eliminates the presence of path switches between the long-distance connecting switch matrices, which reduces the signal delay attributable to path switch intervention.

Described below is an example in which variable logic blocks A and B in FIG. 26 are interconnected by way of long-distance connecting switch matrices SMXf. If the variable logic block intended to be connected is contiguous to a long-distance connecting switch matrix SMXf, as in the case of the block A, the variable logic block is directly connected to that long-distance connecting switch matrix SMXf. If the variable logic block is not contiguous to a long-distance switch matrix SMXf, as in the case of the block B, the variable logic block is first connected to the contiguous short-distance connecting switch matrix SMXn which in turn is connected to the nearest long-distance connecting switch matrix. Thereafter, the two long-distance connecting switch matrices are interconnected, whereby the variable logic blocks A and B are connected.

As described in conjunction with the above examples, the embodiment of the invention involves having the variable logic blocks PLB and switch matrices SMX arranged in the checkerboard pattern, with the block interconnection wiring regions provided by multiple wiring layer techniques above the variable logic blocks. This setup reduces the area occupied by the switch matrices with respect to the area taken up by the logic blocks, whereby the size of the semiconductor chip is reduced.

Figure 29:
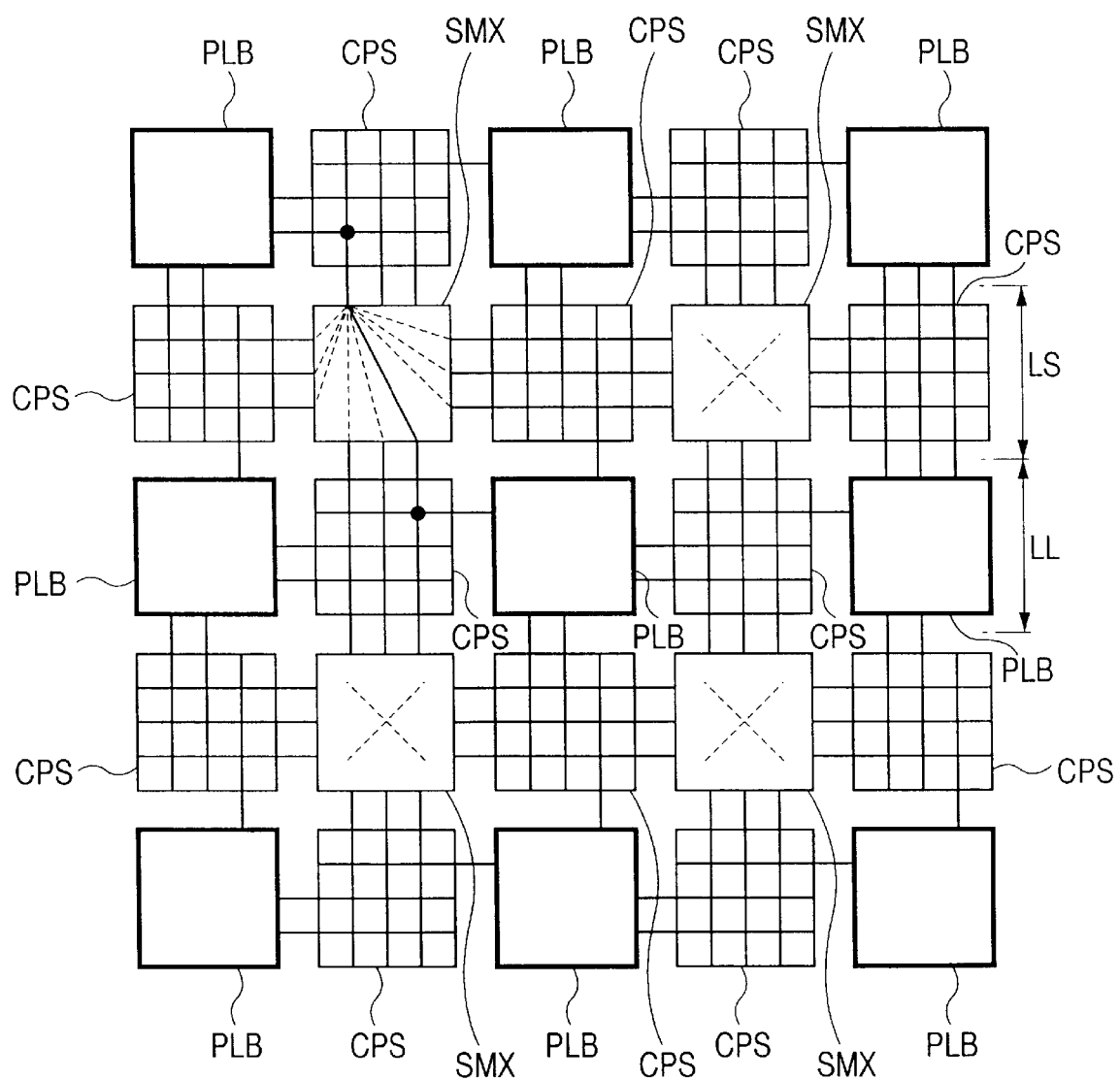
FIG. 29 is a block diagram of a conventional programmable logic LSI.

Given the conventional FPGA of FIG. 29 whose logic portion comprises variable logic blocks, switch matrices and cross point switches, suppose that LL stands for the length of one side of a variable logic block and LS for the length of one side of a switch matrix. In that case, the area per logic block in the conventional FPGA is expressed as (LL+LS)×(LL+LS)

On the other hand, the area per logic block in the logic LSI of the invention is given as 2×Max(LL, LS)$^2$ where, Max(LL, LS)$^2$ means the square of the length LL or LS, whichever is the longer. If LL=LS, then the area per logic block in the conventional FPGA is defined as

4×LL$^2$ whereas the area per logic block in the inventive logic LSI is given as

2×LL$^2$

This means that the area of the logic portion in the inventive logic LSI is as small as half that of the conventional FPGA. A further reduction in the chip size is accomplished by the embodiment having the logic block interconnecting lines U1, U2, S1, S2, R1, R2, L1 and L2 and the I/O lines LS, US, RS and SS formed by the aerial wiring arrangement composed of the wiring layers M3 and M4, with the variable logic blocks PLB and switch matrices SMX connected by the lower wiring layers M1 and M2 under the aerial wiring.

In the embodiment of the invention, the variable logic integrated circuit device is constituted only by variable logic blocks and switch matrices SMX. With no cross point switches utilized, fewer switches are furnished on the wiring lines that interconnect the logic blocks. This helps reduce the delay time in signal transmission, thus implementing a variable logic integrated circuit device capable of high-speed operations.

Furthermore, memory cells of the same type may be used to constitute the switch matrices and variable logic blocks. Such memory cell arrangement confers similarities between the switch matrix and the variable logic block. In the stage of layout pattern designing, the similarities allow design data about one of the two groups of components to be utilized for the other group as well, whereby the layout designing process is facilitated.

Although the description above contains many specificities, these should not be construed as limiting the scope of the invention but as merely providing illustrations of the presently preferred embodiment of this invention, and changes and variations may be made without departing from the spirit or scope of the appended claims. For example, the variable logic blocks are not limited to the circuit structure of FIG. 2; they may be of any circuit type as long as their logic is variable. Instead of the four metal wiring layers making up the embodiment described above, a multiple wiring layer structure of five or more wiring layers may be adopted. The multiple wiring layer structure is not limited to metal wiring layers but may include layers of materials other than metals.

The major benefits of the invention are summarized as follows:

The variable logic integrated circuit device of the invention is formed on a semiconductor chip comprising variable logic blocks and switch matrices laid out alternately in the X and Y directions in the checkerboard pattern. Above the variable logic blocks is the block interconnection wiring arrangement formed by multiple-layer wiring techniques.

Preferably, the wiring for interconnecting the variable logic blocks and the wiring for connecting the variable logic blocks to the switch matrices may be formed in the same layer. The layer of the intra-circuit wiring constituting the variable logic blocks and switch matrices may be located below the layer of the block interconnection wiring.

The switch matrices may be used to interconnect the wiring lines for variable logic block interconnection, as well as to connect the block interconnection wiring to the variable logic blocks.

The arrangements above lower the rate of the area occupied by the switch matrices with respect to the area taken up by the variable logic blocks in the semiconductor chip, whereby the chip size is reduced.

Furthermore, there is a significant reduction in the number of switches furnished on the wiring for interconnecting the logic blocks. This shortens the delay time in signal transmission and thereby helps constitute a variable logic integrated circuit device capable of high-speed operations.

What is claimed is:

1. A variable logic integrated circuit device, comprising:
    a plurality of variable logic blocks of which the logic functions may be variably established;
    a plurality of variable wiring circuits of which the wiring connections may be variably established; and
    a wiring arrangement located above said variable logic blocks for uses other than connecting with said variable logic blocks;
    wherein said variable logic blocks and said wiring circuits are alternately laid out crosswise and lengthwise in a checkerboard pattern on a semiconductor substrate;
    wherein said wiring arrangement includes wiring for connecting noncontiguously located variable logic blocks;
    wherein said variable wiring circuits include short-distance connecting variable wiring circuits for connecting contiguous variable logic blocks and long-distance connecting variable wiring circuits for connecting noncontiguously located variable logic blocks;
    wherein said long-distance connecting variable wiring circuits are located where variable logic blocks would have been located.

2. A variable logic integrated circuit device according to claim 1, further comprising a data write circuit for writing date to any of the memory cells in said variable wiring circuits as well as to any of the memory cells in said variable logic blocks, and control terminals for permitting the input of control signals for enabling and disabling the operation of said data write circuit.

3. A variable logic integrated circuit device according to claim 1, wherein said wiring arrangement is connected to said variable wiring circuits, wherein said variable logic blocks are interconnected by said wiring arrangement and by said variable wiring circuits, and wherein the circuit elements of said variable wiring circuits and of said variable logic blocks are interconnected by a wiring layer located below said wiring arrangement.

4. A variable logic integrated circuit device, comprising:
    a plurality of variable logic blocks of which the logic functions may be variably established;
    a plurality of variable wiring circuits of which the wiring connections may be variably established; and
    a wiring arrangement located above said variable logic blocks for uses other than connecting with said variable logic blocks;
    wherein said variable logic blocks and said wiring circuits are alternately laid out crosswise and lengthwise in a checkerboard pattern on a semiconductor substrate;
    wherein said variable logic blocks each include a plurality of memory cells for holding data, and signal transmission means for selectively transmitting data from said memory cells to an output terminal in accordance with an input signal; and wherein said wiring arrangement supplies signals for selecting any of said memory cells and for writing data to any of said memory cells.

5. A variable logic integrated circuit device according to claim 4, wherein said variable wiring circuits each include a plurality of memory cells for holding data, and a plurality of path switches for selectively turning on or off switching means between appropriate signal lines in accordance with the data held in said memory cells so as to enable signal transmission between said signal lines; and wherein said wiring arrangement supplies signals for selecting any of said memory cells and for writing data to any of said memory cells.

6. A variable logic integrated circuit device according to claim 5, wherein the memory cells in said variable logic blocks are substantially identical to those in said variable wiring circuits.

7. A variable logic integrated circuit device according to claim 5, wherein said signal lines connected by said path switches in said variable wiring circuits constitute signal lines for inputting and outputting signals between contiguous variable logic blocks and for connecting with other variable wiring circuits.

8. A variable logic integrated circuit device according to claim 4, wherein said wiring arrangement is located above both said variable wiring circuits and variable logic blocks.

9. A variable logic integrated circuit device, comprising:
    a plurality of variable logic blocks of which the logic functions may be variably established;
    a plurality of variable wiring circuits of which the wiring connections may be variably established; and
    a wiring arrangement located above said variable logic blocks for uses other than connecting with said variable logic blocks;
    wherein said variable logic blocks and said wiring circuits are alternately laid out crosswise and lengthwise in a checkerboard pattern on a semiconductor substrate;
    wherein said variable wiring circuits each include a plurality of memory cells for holding data, and a plurality of path switches for selectively turning on or off switching means between appropriate signal lines in accordance with the data held in said memory cells so as to enable signal transmission between said signal lines; and wherein said wiring arrangement supplies signals for selecting any of said memory cells and for writing data to any of said memory cells.

10. A variable logic integrated circuit device according to claim 9, wherein said wiring arrangement is located above both said variable wiring circuits and variable logic blocks.

11. A variable logic integrated circuit device formed on a semiconductor chip, comprising:
   a plurality of variable logic blocks of which the logic functions may be variably established;
   a plurality of variable wiring circuits of which the wiring connections may be variably established; and
   a wiring arrangement located above said variable logic blocks for connecting said variable logic blocks;
   wherein said variable logic blocks and said wiring circuits are alternately laid out crosswise and lengthwise in a checkerboard pattern on a semiconductor substrate,
   wherein said wiring arrangement is connected to said variable wiring circuits,
   wherein said variable logic blocks are interconnected to said wiring arrangement and by said variable wiring circuits, and
   wherein the circuit elements of said variable wiring circuits and of said variable logic blocks are interconnected by a wiring layer located below said wiring arrangement;
   wherein said wiring arrangement is constituted by two wiring layers, one of said two wiring layers being formed lengthwise, the other wiring layer being formed crosswise.

12. A variable logic integrated circuit device according to claim 11, wherein said variable wiring circuits include short-distance connecting variable wiring circuits for connecting contiguous variable logic blocks and long-distance connecting variable wiring circuits for connecting noncontiguously located variable logic blocks.

13. A variable logic integrated circuit device according to claim 12, wherein said long-distance connecting variable wiring circuits are located where variable logic blocks would have been located.

14. A variable logic integrated circuit device according to claim 11, further comprising a data write circuit for writing data to any of the memory cells in said variable wiring circuits as well as to any of the memory cells in said variable logic blocks, and control terminals for permitting the input of control signals for enabling and disabling the operation of said data write circuit.

15. A variable logic integrated circuit device according to claim 11, wherein said variable logic blocks each include a plurality of memory cells for holding data, and signal transmission means for selectively transmitting data from said memory cells to an output terminal in accordance with an input signal; and wherein said wiring arrangement supplies signals for selecting any of said memory cells and for writing data to any of said memory cells.

16. A variable logic integrated circuit device according to claim 15, wherein said variable wiring circuits each include a plurality of memory cells for holding data, and a plurality of path switches for selectively turning on switching means between appropriate signal lines in accordance with the data held in said memory cells so as to enable signal transmission between said signal lines; and wherein said wiring arrangement supplies signals for selecting any of said memory cells and for writing data to any of said memory cells.

17. A variable logic integrated circuit device according to claim 11, wherein said variable wiring circuits each include a plurality of memory cells for holding data, and a plurality of path switches for selectively turning on switching means between appropriate signal lines in accordance with the data held in said memory cells so as to enable signal transmission between said signal lines; and wherein said wiring arrangement supplies signals for selecting any of said memory cells and for writing data to any of said memory cells.

18. A variable logic integrated circuit device comprising:
   a plurality of variable logic blocks of which the logic functions may be variably established; and
   a plurality of variable wiring circuits of which the wiring connections may be variably established;
   wherein said variable logic blocks and variable wiring circuits are arranged on a semiconductor substrate such that said variable logic blocks are arranged in a first direction and in a second direction perpendicular to said first direction,
   wherein an interconnection within said variable logic blocks and said variable wiring circuits are made by a first wiring arrangement,
   wherein said variable wiring circuits are electrically connected to said variable logic blocks and a second wiring arrangement for connecting between said variable logic blocks,
   wherein said second wiring arrangement is formed over said first wiring arrangement and extends over said variable logic blocks,
   wherein said second wiring arrangement includes a first wiring layer extending in said first direction and a second wiring layer extending in said second direction,
   wherein an interconnect between said variable logic blocks is made by said second wiring arrangement and said variable wiring circuits.

19. A variable logic integrated circuit device according to claim 18, wherein said variable wiring circuits include short-distance connecting variable wiring circuits for connecting contiguous variable logic blocks and long-distance connecting variable wiring circuits for connecting noncontiguously located variable logic blocks.

20. A variable logic integrated circuit device according to claim 19, wherein said long-distance connecting variable wiring circuits are located where variable logic blocks would have been located.

21. A variable logic integrated circuit device according to claim 18, wherein said variable logic block includes memory cells for holding data, and signal transmission means for selectively transmitting data from said memory cells to an output terminal in accordance with an input signal,
   wherein said second wiring arrangement includes wiring lines which supply signals for selecting any of said memory cells and for wiring data to any of said memory cells.

22. A variable logic integrated circuit device according to claim 18, wherein said variable wiring circuit includes memory cells for holding data, and path switches for selectively turning on or off switching means between appropriate signal lines in accordance with the data held in said memory cells so as to enable signal transmission between said signal lines,
   wherein said second wiring arrangement includes wiring lines which supply signals for selecting any of said memory cells and for wiring data to any of said memory cells.

23. A variable logic integrated circuit device according to claim 18, wherein said variable logic block includes memory cells for variably establishing the logic functions, wherein said variable wiring circuit includes memory cells for variably establishing the wiring connections.

24. A variable logic integrated circuit device according to claim 23, wherein the memory cells in said variable logic blocks are substantially identical to those in said variable wiring circuits.

25. A variable logic integrated circuit device according to claim 18, wherein said variable wiring circuits are arranged between said variable logic blocks.

\* \* \* \* \*